(12) United States Patent
Namiki et al.

(10) Patent No.: US 7,550,248 B2
(45) Date of Patent: Jun. 23, 2009

(54) RESIST PATTERN THICKENING MATERIAL AND PROCESS FOR FORMING RESIST PATTERN, AND SEMICONDUCTOR DEVICE AND PROCESS FOR MANUFACTURING THE SAME

(75) Inventors: Takahisa Namiki, Kawasaki (JP); Koji Nozaki, Kawasaki (JP); Miwa Kozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/319,161

(22) Filed: Dec. 28, 2005

(65) Prior Publication Data

US 2007/0048659 A1    Mar. 1, 2007

(30) Foreign Application Priority Data

Aug. 25, 2005    (JP) ............................. 2005-244707

(51) Int. Cl.
*G03F 7/00*   (2006.01)
*G03F 7/004*  (2006.01)

(52) U.S. Cl. .................... 430/270.1; 430/311; 430/905; 430/913; 430/273.1

(58) Field of Classification Search .............. 430/270.1, 430/311, 905, 913
See application file for complete search history.

(56) References Cited

U.S. PATENT DOCUMENTS

| | | | |
|---|---|---|---|
| 5,858,620 A * | 1/1999 | Ishibashi et al. | 430/313 |
| 6,319,853 B1 * | 11/2001 | Ishibashi et al. | 438/780 |
| 6,555,607 B1 | 4/2003 | Kanda et al. | |
| 6,579,657 B1 * | 6/2003 | Ishibashi et al. | 430/270.1 |
| 6,811,817 B2 | 11/2004 | Sugeta et al. | |
| 2003/0096903 A1 | 5/2003 | Sugeta et al. | |

(Continued)

FOREIGN PATENT DOCUMENTS

EP    1 273 974 A2    1/2003

(Continued)

OTHER PUBLICATIONS

Takeo Ishibashi et al.; "Advanced Micro-Lithography Process with Chemical Shrink Technology", Japan J. Appl. Phys, vol. 40, Part, 1, No. 1, Jan. 2001, pp. 419-425.

(Continued)

*Primary Examiner*—Amanda C. Walke
(74) *Attorney, Agent, or Firm*—Westerman, Hattori, Daniels & Adrian, LLP.

(57) ABSTRACT

The object of the present invention is to provide a resist pattern thickening material, etc. which, when coated over a resist pattern formed of ArF resist material, etc., can efficiently thicken the resist pattern such as lines and spaces pattern, etc. regardless of the composition of ArF resist material, and the like; which can easily control the thickening amount of resist pattern by process condition; and which can easily and efficiently form a fine space pattern beyond the exposure (resolution) limits of light sources of the exposure devices at low cost. The resist pattern thickening material of the present invention comprises a solubilizer which melts the resist pattern at the temperature near its melting point and- a water-soluble element. The process for forming a resist pattern of the present invention comprises forming a resist pattern and coating a resist pattern thickening material of the present invention over the surface of the resist pattern.

17 Claims, 17 Drawing Sheets

U.S. PATENT DOCUMENTS

| | | | |
|---|---|---|---|
| 2003/0102285 A1 | 6/2003 | Nozaki et al. | |
| 2003/0157801 A1* | 8/2003 | Kozawa et al. | 438/689 |
| 2003/0175624 A1 | 9/2003 | Nozaki et al. | |
| 2004/0029047 A1 | 2/2004 | Ishibashi et al. | |
| 2004/0067452 A1 | 4/2004 | Sugeta et al. | |
| 2004/0104196 A1 | 6/2004 | Nakamura et al. | |
| 2004/0106737 A1 | 6/2004 | Sugeta et al. | |
| 2004/0110099 A1 | 6/2004 | Kozawa et al. | |
| 2004/0121615 A1 | 6/2004 | Kaneko et al. | |
| 2004/0137377 A1 | 7/2004 | Shinbori et al. | |
| 2005/0009365 A1 | 1/2005 | Sugeta et al. | |
| 2005/0058950 A1 | 3/2005 | Sugeta et al. | |
| 2005/0175927 A1* | 8/2005 | Kishioka et al. | 430/270.1 |
| 2005/0245663 A1 | 11/2005 | Sugeta et al. | |
| 2006/0154174 A1 | 7/2006 | Hada et al. | |

FOREIGN PATENT DOCUMENTS

| | | |
|---|---|---|
| EP | 1 315 043 A1 | 5/2003 |
| EP | 1 343 052 A2 | 9/2003 |
| EP | 1 376 242 A1 | 1/2004 |
| EP | 1 385 059 A1 | 1/2004 |
| EP | 1 398 671 A1 | 3/2004 |
| EP | 1 403 717 A1 | 3/2004 |
| EP | 1 429 185 | 6/2004 |
| EP | 1 469 354 A1 | 10/2004 |
| EP | 1 489 463 A2 | 12/2004 |
| EP | 1 513 013 A2 | 3/2005 |
| EP | 1 542 079 A1 | 6/2005 |
| EP | 1 610 184 A1 | 12/2005 |
| EP | 1 643 306 A1 | 4/2006 |
| JP | 5-197151 | 8/1993 |
| JP | 06-250379 A | 9/1994 |
| JP | 10-073927 | 3/1998 |
| JP | 11-204399 | 7/1999 |
| JP | 2000-267268 | 9/2000 |
| JP | 2000-347414 | 12/2000 |
| JP | 2001-019860 | 1/2001 |
| JP | 2001-033984 | 2/2001 |
| JP | 2001-228616 | 8/2001 |
| JP | 2002-6491 | 1/2002 |
| JP | 2002-6512 | 1/2002 |
| JP | 2002-49161 | 2/2002 |
| JP | 2003-084457 | 3/2003 |
| JP | 2003-131400 | 5/2003 |
| JP | 2004-53723 | 2/2004 |
| JP | 2004-86203 | 3/2004 |
| JP | 2004-264373 | 9/2004 |
| WO | 2004/074941 | 9/2004 |
| WO | WO 2005/006078 A1 | 1/2005 |

OTHER PUBLICATIONS

Mamoru Terai et al.; "Below 70-nm Contact Hole Patern with RELACS Process on ArF Resist," Proceedings of SPIE, vol. 5039, 2003, pp. 789-797.

Extended European Search Report dated Jul. 21, 2006, issued in corresponding Europen Application No. 05026737.6.

Yang Xiaomin et al: "Electron-beam SAFIER™; process and its application for magnetic thin-film heads" Journal of Vacuum. Science and Technology. B, Microelectronics and Nanometer Structures Processing, Measurements and Phenomena, American Institute of Physics, New York, NY, US, vol. 22, No. 6, Dec. 13, 2004, pp. 3339-3343.

Wallace C et al: "Optimization of resist shrink techniques for contact hole and metal trench ArF lithography at the 90-nm technology node" Proceedings of the SPIE—The International Society for Optical Engineering SPIE-INT. Soc. Opt. Eng. USA, vol. 5376, No. 1, 2004, pp. 238-244.

Satyanarayana S et al: "Evaluation of process based resolution enhancement techniques to extend 193nm lithography" Proceedings of the SPIE—The International Society for Optical Engineering SPIE—INT. Soc. Opt. ENG. USA, vol. 5039, 2003, pp. 257-268.

Office Action dated Oct. 28, 2006 issued in the corresponding Korean Application No. 10-2005-0116202.

* cited by examiner

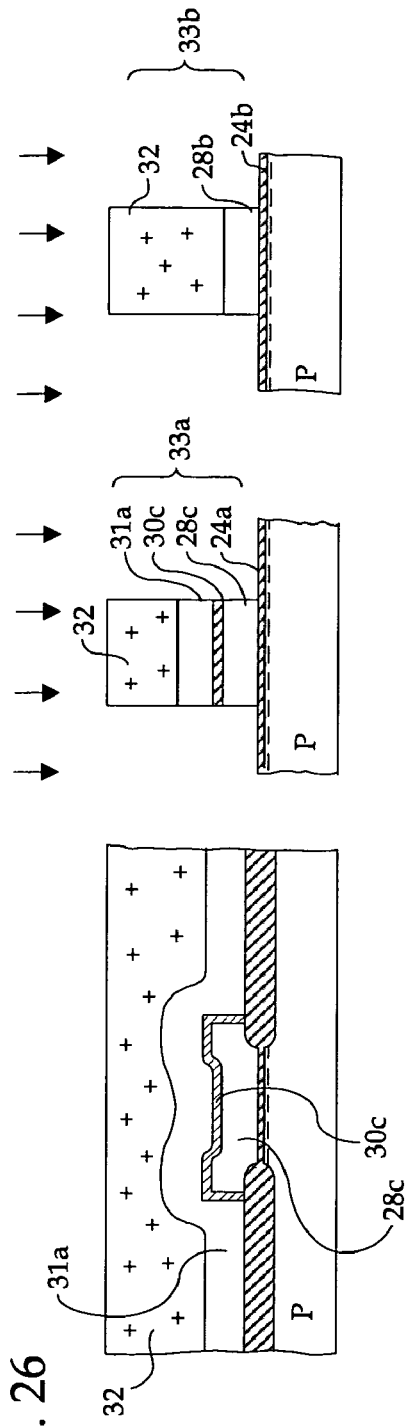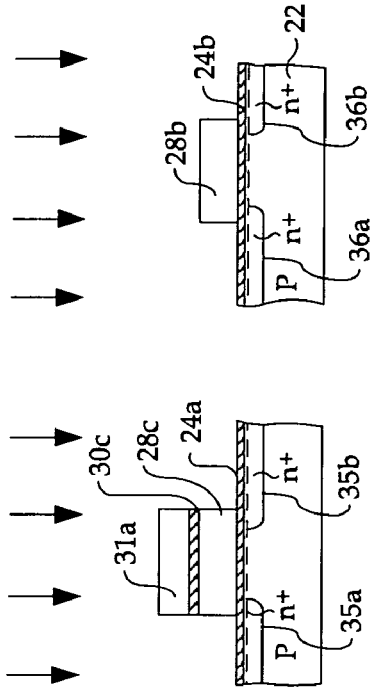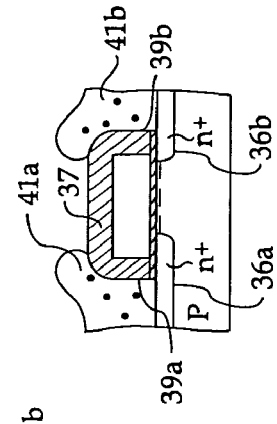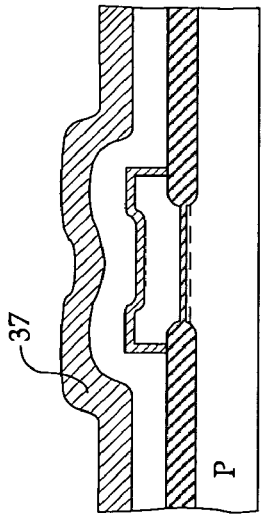
FIG. 26
FIG. 27
FIG. 28

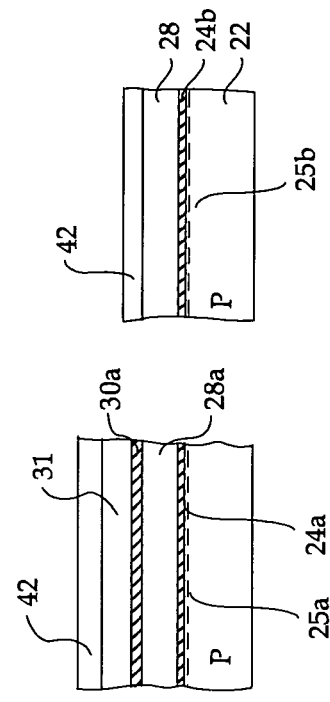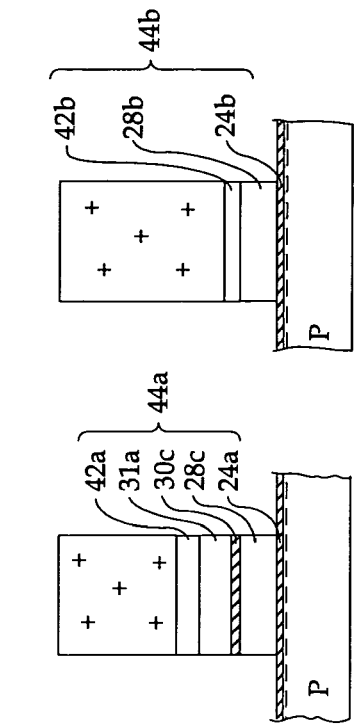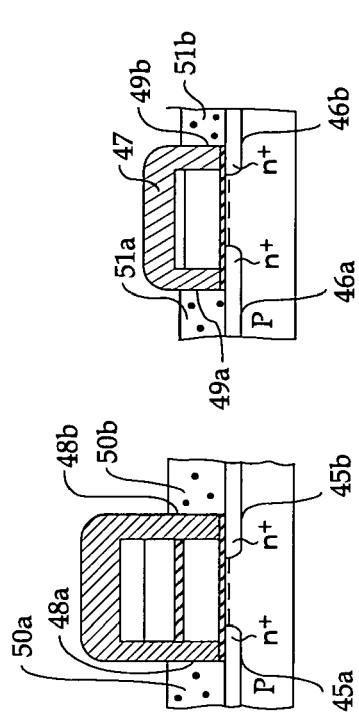
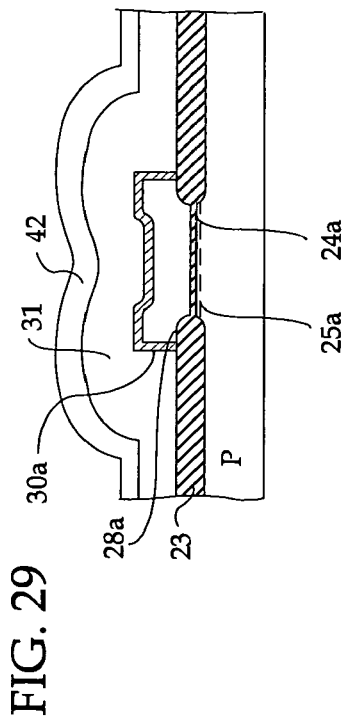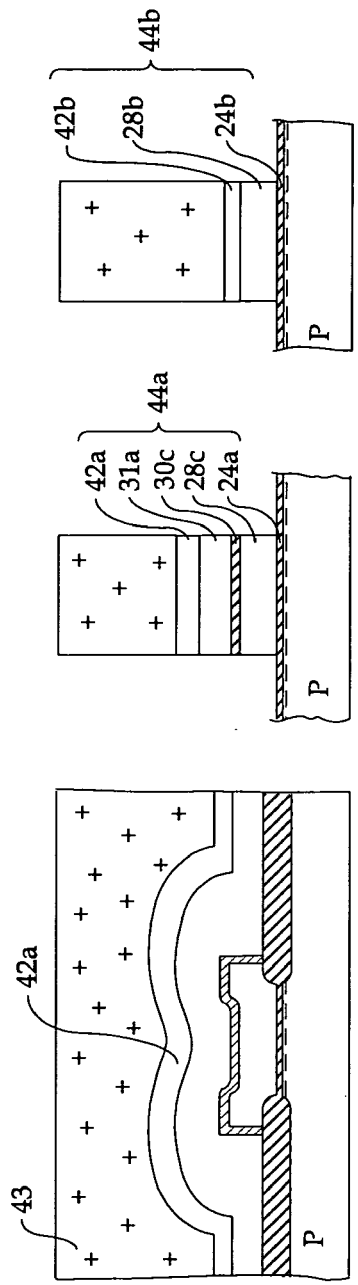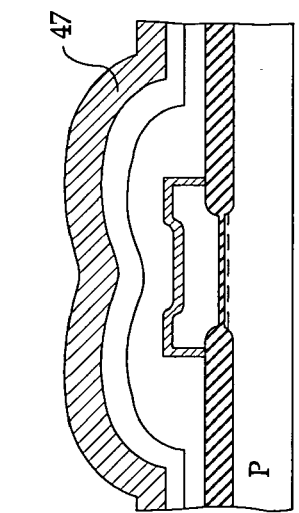
FIG. 29
FIG. 30
FIG. 31

RESIST PATTERN THICKENING MATERIAL AND PROCESS FOR FORMING RESIST PATTERN, AND SEMICONDUCTOR DEVICE AND PROCESS FOR MANUFACTURING THE SAME

CROSS-REFERENCE TO RELATED APPLICATIONS

This application is based upon and claims the benefits of the priority from the prior Japanese Patent Application No. 2005-244707, filed on Aug. 25, 2005, the entire contents of which are incorporated herein by reference.

BACKGROUND OF THE INVENTION

1. Field of the Invention

The present invention relates to a resist pattern thickening material with which thickening of the resist pattern formed in manufacturing a semiconductor device and forming a fine space pattern beyond the exposure limits of light sources of existing exposure devices are possible. The present invention also relates to a process for forming a resist pattern, a semiconductor device and a process for manufacturing the semiconductor device that utilize the resist pattern thickening material respectively.

2. Description of the Related Art

Semiconductor integrated circuits are becoming more highly integrated and LSIs and VLSIs have been put into practical use. Accompanying this trend, wiring patterns are downsized to 0.2 µm or less and the smallest patterns reaches even 0.1 µm or less. A lithographic technique is extremely important in forming fine wiring patterns. In the lithographic technique, a substrate is coated by a resist film, selectively exposed and further developed to form a resist pattern. Dry etching is carried out using the resist pattern as a mask and by removing the resist pattern thereafter, a desired pattern such as wiring pattern, etc. is obtained. In the lithographic technique, it is required for the exposure light (light used for exposure) to be a short wavelength as well as for high-resolution resist materials corresponding to the characteristics of exposure light to be developed.

However, in order for an exposure light to be a short wavelength, it is necessary to improve the exposure device which may involve enormous cost. Further, the development of new resist materials suitable for an exposure light with short wavelength is not easy.

To overcome above technical problems, a technique has been proposed wherein finer pattern is formed by using a resist pattern thickening material (hereinafter may be referred to as "resist swelling material") with which a resist pattern formed of conventional resist material is thickened and fine space pattern can be obtained. For instance, Japanese Patent Application Laid-Open JP-A) No. 10-73927 discloses a technique called RELACS. According to the disclosure, a KrF resist pattern is formed by exposing a KrF (krypton fluoride) resist film using KrF (krypton fluoride) excimer laser light of 248 nm wavelength which is deep ultraviolet light. Thereafter, by means of a water-soluble resin composition, a coated film is provided over KrF resist pattern. The coated film and KrF resist pattern are made to interact at the interface thereof using the residual acid within the material of KrF resist pattern, and the KrF resist pattern is thickened (hereinafter may be referred to as "swelling"). In this way, the distance between KrF resist patterns is shortened (or diameter of hole is shortened in the case of hole pattern) and a fine space pattern is formed. Thereafter, a desired pattern (e.g. wiring pattern) having the same dimension as the space pattern is formed.

In RELACS technique, however, thickening is conducted by using an acid which works as a catalyzer to generate a crosslinking reaction and a large amount of thickening is obtained with a very small amount of acid therefore controlling the amount of thickening is difficult. In particular, when forming a fine pattern, the large thickening amount of resist pattern may hinder practical application and the thickening amount in the range of several dozen nm is often sufficient. However, in the resist pattern thickening technique which depends on acid diffusion from the resist pattern and resultant crosslinking reaction accelerated by an acid, fine adjustment of the thickening amount is difficult and controlling the thickening amount becomes more difficult by conditions such as temperature or density difference in patterns, etc. because it uses an acid. The density difference in patterns is the density difference between a region where resist patterns are scarce (a region where intervals of resist patterns are long) and a region where resist patterns are dense (a region where intervals of resist patterns are short).

Moreover, in RELACS technique, there are following problems. The KrF resist for use is formed of an aromatic resin composition including a novolak resin, naphthoquinonediazide resin or the like. An aromatic ring contained in the aromatic resin composition allows KrF excimer laser light (wavelength: 248 nm) to pass through, but absorbs ArF (argon fluoride) excimer laser light (wavelength: 193 nm) having a shorter wavelength than KrF excimer laser light and does not allow ArF excimer laser light to pass through. Therefore, when KrF resist is used, ArF excimer laser light cannot be used as exposure light and forming a finer wiring pattern, etc. becomes impossible. Moreover, there is a problem in the RELACS technique that the resist swelling material is effective for thickening or swelling of KrF resist but not for thickening or swelling of ArF resist. In addition, the resist swelling material used for RELACS has a problem such that even though it is effective for thickening (swelling) of KrF resist pattern, it is not effective for thickening (swelling) of ArF resist pattern.

From the standpoint of forming a fine wiring pattern, it is desirable to use exposure light of wavelength shorter than that of KrF excimer laser light (wavelength of 248 nm). For example, ArF excimer laser light (wavelength of 193 nm) may be preferable. When x-ray or electron beam having a wavelength shorter than ArF excimer laser light is used for pattern forming, however, it results in high cost and low productivity. Thus, the utilization of ArF excimer laser light is desired.

Accordingly, development of a technique which can use ArF excimer laser light as an exposure light during patterning; can easily control the thickening amount of the resist pattern which is difficult for RELACS technique; can adjust thickening amount of resist pattern without relying on the conditions such as temperature, density difference of pattern, or the like; and can easily form a fine space pattern and/or a wiring pattern at low cost is desired.

An object of the present invention is to provide a resist pattern thickening material, which can utilize ArF excimer laser light as an exposure light during patterning; which, when coated over a resist pattern, can thicken the resist pattern such as lines and spaces pattern, etc. regardless of the composition of ArF resist material, and the like; which can easily control the thickening amount of resist pattern by process condition; and which can easily and efficiently form a fine space pattern beyond the exposure (resolution) limits of light sources of the exposure devices at low cost.

Another object of the present invention is to provide a process for forming a resist pattern which can utilize ArF excimer laser light as an exposure light during patterning; which can thicken the resist pattern such as lines and spaces pattern, etc. regardless of the composition of ArF resist material, and the like; which can easily control the thickening amount of resist pattern by process condition; and which can easily and efficiently form a fine space pattern beyond the exposure (resolution) limits of light sources of the exposure devices at low cost.

Yet another object of the present invention is to provide a process for manufacturing a semiconductor device which can utilize ArF excimer laser light as an exposure light during patterning; which can form a fine space pattern beyond the exposure (resolution) limits of light sources of the exposure devices; and which can mass produce high-performance semiconductor devices having fine wiring patterns formed by using the space pattern; and a high-performance semiconductor having fine wiring patterns manufactured by the process for manufacturing a semiconductor device.

SUMMARY OF THE INVENTION

In view of the above-mentioned problems, inventors of the present invention have investigated vigorously and have obtained the following knowledge. Specifically, when a resist pattern is swelled using a conventional resist swelling material, because it relies on crosslinking reaction accelerated by an acid or its diffusion, the swelling amount (thickening amount) is altered greatly by the thickening conditions of temperature, density difference of pattern, or the like. However, it was found that when a solubilizer which melts the resist pattern at the temperature near its melting point and water-soluble element are used as a resist pattern thickening material, the thickening amount of resist pattern can be easily controlled regardless of thickening conditions because no crosslinking reaction by an acid is used.

The present invention is based on above knowledge and means for solving aforesaid problems are described in attached claims.

The resist pattern thickening material of the present invention contains a solubilizer and a water-soluble element wherein the solubilizer melts a resist pattern at the temperature near its melting point.

In the resist pattern thickening material, a solubilizer which melts the resist pattern at the temperature near its melting point (hereafter may be referred to as "solubilizer") is dispersed in water-soluble element and when the resist pattern thickening material is coated on the resist pattern and heated at near the melting point of the solubilizer, the solubilizer becomes fused. Then the material of the resist pattern is melted by fused solubilizer and the water-soluble element, solubilizer and the material of the resist pattern interact (are mixed) with each other. At this time, a surface layer (mixing layer), where the resist pattern thickening material and the resist pattern are mixed, is efficiently formed on the surface of the resist pattern which becomes an inner layer. As a result, the resist pattern is efficiently thickened (hereafter may be referred to as "swelling") by the resist pattern thickening material. The resist pattern thickened in this way (hereinafter may be referred to as "thickened resist pattern") is thickened uniformly by the resist pattern thickening material. Thus, a space pattern formed by the thickened resist pattern has a fine structure beyond the exposure or resolution limits. The term "space pattern" is hereby defined as a hole, trench, recess, or any other empty space that is formed by developing a resist.

Since the resist pattern thickening material of the present invention contains a solubilizer which melts the resist pattern at the temperature near its melting point and a water-soluble element and does not contain crosslinkable element, therefore, no crosslinking reaction is induced by acid and a good thickening effect can be obtained regardless of thickening conditions such as temperature, density difference of pattern, etc. and the thickening amount of the resist pattern can be easily controlled to form a desired space pattern. Thus, the resist pattern thickening material of the present invention can be suitably utilized for forming a resist pattern such as lines and spaces pattern, etc. used for wiring layer of LOGIC LSI where resist patterns of various sizes are mixed.

The process for forming a resist pattern of the present invention includes forming a resist pattern, and then coating a resist pattern thickening material of the present invention over the surface of the resist pattern. In the process for forming a resist pattern of the present invention, a resist pattern is formed and when the resist pattern thickening material is coated over the resist pattern and heated at near the melting point of the solubilizer, the solubilizer within the resist pattern thickening material, which are dispersed in water-soluble element and melts the resist pattern at the temperature near its melting point, is fused. Then the material of the resist pattern is melted by fused solubilizer and the water-soluble element, the solubilizer and the material of the resist pattern interact (are mixed) with each other. Thus, a surface layer (mixing layer), where the resist pattern thickening material and the resist pattern are mixed, is formed on the surface of the resist pattern which becomes an inner layer. The resulting thickened resist pattern is uniformly thickened by the resist pattern thickening material. Thus, the space pattern formed by the thickened resist pattern has a fine structure beyond the exposure or resolution limits. Since the resist pattern thickening material of the present invention contains a solubilizer which melts the resist pattern at the temperature near its melting point and a water-soluble element and does not contain crosslinkable element, therefore, no crosslinking reaction is induced by an acid and a good thickening effect can be obtained regardless of thickening conditions such as temperature, density difference of pattern, etc. and the thickening amount of the resist pattern can be easily controlled to form a desired space pattern. Thus, the process for forming a resist pattern can be suitably utilized for forming a resist pattern such as lines and spaces pattern, etc. used for wiring layer of LOGIC LSI where not only a contact-hole pattern, but also resist patterns of various sizes are mixed.

The process for manufacturing a semiconductor device of the present invention includes forming a resist pattern where a resist pattern is formed on a surface of a workpiece and a resist pattern thickening material is coated over the surface of resist pattern; and patterning where the surface of the workpiece is patterned by etching using the thickened resist pattern as a mask.

In the process for manufacturing a semiconductor device, initially, forming a resist pattern takes place where a resist pattern is formed on the surface of the workpiece on which patterns such as wiring patterns, etc. are formed, and then the resist pattern thickening material of the present invention is coated over the surface of the resist pattern and heated. Then, the solubilizer within the resist pattern thickening material, which is dispersed in water-soluble element and melt the resist pattern at the temperature near its melting point, is fused. Then the material of the resist pattern is melted by fused solubilizer and the water-soluble element, the solubilizer and the material of the resist pattern interact (are mixed)

with each other. Thus, a surface layer (mixing layer), where the resist pattern thickening material and the resist pattern are mixed, is formed on the surface of the resist pattern which becomes an inner layer. The resulting thickened resist pattern is uniformly thickened by the resist pattern thickening material. Thus, the space pattern formed by the thickened resist pattern has a fine structure beyond the exposure or resolution limits. Since the resist pattern thickening material of the present invention contains a solubilizer which melts the resist pattern at the temperature near its melting point and a water-soluble element and does not contain crosslinkable element, therefore, no crosslinking reaction is induced by an acid and a good thickening effect can be obtained regardless of thickening conditions such as temperature, density difference of pattern, etc. and the thickening amount of the resist pattern can be easily controlled to form a desired space pattern. Thus, thickened resist patterns such as line patterns, etc. used for wiring layer of LOGIC LSI, a semiconductor device where not only a contact-hole pattern, but also resist patterns of various sizes are mixed, is formed easily and precisely.

In patterning, the surface of the workpiece is patterned finely and precisely with accurate dimension by etching the surface of the workpiece using the thickened resist pattern formed by forming a resist pattern, and high-quality and high performance semiconductor devices having fine and precise wiring pattern with accurate dimension can be efficiently produced.

The semiconductor device of the present invention is manufactured by the process for manufacturing a semiconductor device of the present invention. The semiconductor device has fine and precise patterns such as wiring pattern, etc. with accurate dimension and of high quality and high performance.

BRIEF DESCRIPTION OF THE DRAWINGS

FIG. 26 is a cross-sectional schematic diagram for explaining an example of a process for manufacturing the FLASH EPROM manufactured by a semiconductor device of the present invention, showing a next step of FIG. 25.

FIG. 27 is a cross-sectional schematic diagram for explaining an example of a process for manufacturing the FLASH EPROM manufactured by a semiconductor device of the present invention, showing a next step of FIG. 26.

FIG. 28 is a cross-sectional schematic diagram for explaining an example of a process for manufacturing the FLASH EPROM manufactured by a semiconductor device of the present invention, showing a next step of FIG. 27.

FIG. 29 is a cross-sectional schematic diagram for explaining another example of a process for manufacturing the FLASH EPROM manufactured by a semiconductor device of the present invention.

FIG. 30 is a cross-sectional schematic diagram for explaining another example of a process for manufacturing the FLASH EPROM manufactured by a semiconductor device of the present invention, showing a next step of FIG. 29.

FIG. 31 is a cross-sectional schematic diagram for explaining another example of a process for manufacturing the FLASH EPROM manufactured by a semiconductor device of the present invention, showing a next step of FIG. 30.

Figure 1A:
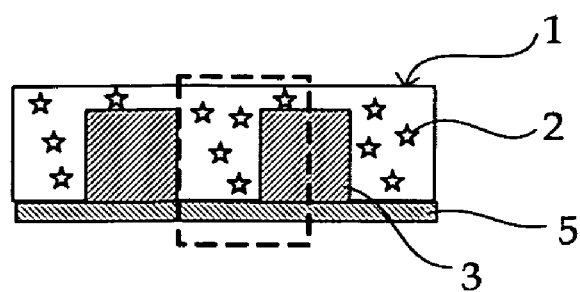
FIG. 1A is a schematic diagram for explaining an example of the mechanism of thickening a resist pattern by using a resist pattern thickening material of the present invention, showing the state where the resist pattern thickening material is coated over the surface of the resist pattern.

DESCRIPTION OF THE PREFERRED EMBODIMENTS (Resist Pattern Thickening Material)

The resist pattern thickening material of the present invention comprises at least a solubilizer which melts a resist pattern at the temperature near its melting point and a water-soluble element and may further comprise a surfactant, a phase transfer catalyst, a water-soluble aromatic compound, an organic solvent and other components suitably selected accordingly.

—Solubilizer which Melts a Resist Pattern at the Temperature Near Its Melting Point—

It is necessary for the solubilizer to be able to melt a resist pattern at the temperature near its melting point. It is preferable that the solubilizer melts the resist pattern within the melting point of ±20° C. and more preferably within the melting point of ±10° C. If this is the case, it is advantageous for being easily controllable.

The melting point is not particularly limited and may be selected accordingly. Though it is possible to form a mixing layer and thicken the resist pattern when the melting point is at or below the room temperature (and the solubilizer is in a liquid state at the room temperature), it is preferably 50° C. to 150° C. and more preferably 80° C. to 130° C.

When the melting point is less than 50° C., uniform thickening amount may not be obtained and when it is more than 150° C., effects such as resist reflow, and the like occur and uniform thickening amount may not be obtained.

The measurement method of the melting point is not particularly limited and may be selected accordingly, and examples include measurement using a melting point measuring machine.

The solubilizer is preferably water-soluble and in particular, it is preferable that 0.1 g or more is dissolved in 100 g of water at a water-temperature of 25° C. to obtain sufficient reactivity.

The solubilizer is not particularly limited and may be selected accordingly, and it is preferably an organic matter which can melt and dissolve the resist pattern for mixing.

The organic matter is not particularly limited and may be selected accordingly and examples include organic salt, alcohol, carboxylic acid and amine.

The organic salt can be produced by directly reacting acid element and alkali element.

The anionic element in the organic salt is not particularly limited and may be selected accordingly. Examples include trifluoromethansulfonium anion, nonafluorobutansulfonium anion, benzenesulfonium anion, p-toluenesulfonium anion, acetic acid anion, benzoic acid anion, and the like. These may be used alone or in combination.

The cationic element in the organic salt is not particularly limited and may be selected accordingly. Examples include benzyltriethylammonium cation, benzylammonium cation, methoxybenzylammonium cation, ethylammonium cation, diethylammonium cation, triethylammonium cation, ammonium cation, tetramethylammonium cation, and the like. These may be used alone or in combination.

Specific examples of the organic salt obtained from a direct reaction between an acid and an alkali include benzyltriethylammonium trifluoromethansulfonic acid salt (mp. 109° C.), toluenesulfonic acid methoxybenzylamine salt (mp. 110° C.), trifluoromethansulfonic acid methoxybenzylamine salt (mp. 121° C.), and the like.

Alcohols are not particularly limited and may be selected accordingly. Suitable examples include salicyl alcohol (mp. 87° C.), 2-nitrobenzylalcohol, trans-1,2-cyclopentandiol, 2-amino-3-methylbenzylalcohol, 3-amino-2-methylbenzylalcohol, 3-amino4-methylbenzylalcohol, and the like of which melting points are within the range of 50° C. to 150° C. These may be used alone or in combination. Of these, aminobenzylalcohols such as salicyl alcohol, 2-amino-3-methylbenzylalcohol, 3-amino-2-methylbenzylalcohol, 3-amino4-methylbenzylalcohol, and the like are preferable for exhibiting good solubility in water.

The carboxylic acid is not particularly limited and may be selected accordingly. Suitable examples include 1-phenyl-1-cyclopropanecarboxylic acid (mp. 86° C.), 1-phenyl-1-cyclohexanecarboxylic acid, picoline acid, and the like of which melting points are within the range of 50° C. to 150° C. These may be used alone or in combination.

The amines are not particularly limited and may be selected accordingly. Suitable examples include anilinophenol, diphenylamine (mp. 53° C.), 1-naphthylamine, and the like. These may be used alone or in combination.

The loadings of solubilizer which melts the resist pattern at the temperature near its melting point relative to 100 parts by mass of the water-soluble element is not particularly limited and may be adjusted accordingly. It is preferably 1 part by mass to 100 parts by mass and more preferably 5 parts by mass to 50 parts by mass.

If the loadings is less than 1 part by mass, the thickening effect of resist pattern may not be satisfactory and if it is more than 100 parts by mass, crystal of solubilizer is deposited due to degraded film-forming ability and resist pattern may not be thickened uniformly.

The method for confirming the existence of the solubilizer which melts the resist pattern at the temperature near its melting point in the resist pattern thickening material is not particularly limited and may be selected accordingly and this may be done by an analysis using infrared spectroscopy.

—Water-Soluble Element—

The water-soluble element is not particularly limited as long as it exhibits water-solubility and may be selected accordingly. It is preferably having water-solubility of which 0.1 g or more is dissolved in 100 g of water at a water temperature of 25° C. Examples include polyvinyl alcohol, polyvinyl acetal, polyvinyl acetate, polyvinyl pyrrolidone, cellulose, tannin, catechin, chitin, chitosan, oxazoline group-containing water-soluble resin, water-soluble melamine resin, water-soluble urea resin, and the like. These may be used alone or in combination. Of these, polyvinyl alcohol, polyvinyl acetal, polyvinyl pyrrolidone, cellulose, tannin, and the like are particularly preferable in terms of film-forming ability.

The loadings of water-soluble element in the resist pattern thickening material may be suitably selected according to the nature or content of solubilizer which melts the resist pattern at the temperature near its melting point, and the like.

—Surfactant—

When it is required, for example, to improve the conformability between a resist pattern thickening material and a resist pattern, to obtain a larger thickening amount of resist pattern, to improve uniformity of the thickening effect at the interface between a resist pattern thickening material and a resist pattern, and to have anti-forming property, the addition of the surfactant can fulfill the requirement.

The surfactant is not particularly limited and may be selected accordingly. Examples thereof include nonionic surfactants, cationic surfactants, anionic surfactants, amphoteric surfactants, and the like. These may be used alone or in combination. Among them, nonionic surfactants are preferred from the point that they do not contain metallic ions such as sodium ion, potassium ion, and the like.

Suitable examples of nonionic surfactants include alkoxylate surfactants, fatty acid ester surfactants, amide surfactants, alcohol surfactants, and ethylenediamine surfactants. Specific examples thereof include polyoxyethylene-polyoxypropylene condensation compounds, polyoxy alkylene alkylether compounds, polyoxy ethylene alkylether compounds, polyoxy ethylene derivative compounds, sorbitan fatty acid ester compounds, glycerine fatty acid ester compounds, primary alcohol ethoxylate compounds, phenol ethoxylate compounds, nonyl phenol ethoxylate compounds, octyl phenol ethoxylate compounds, lauryl alcohol ethoxylate compounds, oleyl alcohol ethoxylate compounds, fatty acid ester, amide, natural alcohol, ethylenediamine, secondary alcohol ethoxylate, and the like.

The cationic surfactants are not particularly limited and may be selected accordingly. Examples thereof include alkyl cationic surfactants, amide quaternary cationic surfactants, ester quaternary cationic surfactants, and the like.

The amphoteric surfactants are not particularly limited may be selected accordingly. Examples thereof include amine oxide surfactants, betaine surfactants, and the like.

The content of the surfactant in the resist pattern thickening material is not particularly limited may be selected according to the nature, content, etc., of the solubilizer which melts the resist pattern at the temperature near its melting point, water-soluble element, phase transfer catalyst, etc. Suitable range of the content of the surfactant is, for example, 0.01 parts by mass or more relative to 100 parts by mass of the resist pattern thickening material, and it is preferably 0.03 parts by mass to 2 parts by mass, and more preferably 0.05 parts by mass to 0.5 parts by mass in terms of excelling in reaction amount and in-plane uniformity.

When the content of the surfactant is 0.01 parts by mass or less, there is an effect coating property improvement, however, in most cases, the reaction amount of the resist pattern thickening material hardly differ compared with the case where no surfactant is added.

—Phase Transfer Catalyst—

The phase transfer catalyst is not particularly limited and may be selected accordingly. Examples thereof are organic materials and among them, basic materials are particularly suitable.

When the resist pattern thickening material comprises the phase transfer catalyst, it is advantageous in that reactivity between the resist film and the thickening material immediately after coating can be improved by the characteristics of the phase transfer catalyst which is capable of moving in and out between solids and liquids, exhibiting a good and uniform thickening effect regardless of the nature of the resist pattern material and having less dependence on the resist pattern material. Such effects of the phase transfer catalyst are not impaired, for example, even if the resist pattern, which is the subject to be thickened with the use of the resist pattern thickening material, contains an acid generating agent or not.

The phase transfer catalyst is preferably water-soluble, and exhibits water-solubility of 0.1 g in 100 g of water at a water-temperature of 25° C.

Specific examples of the phase transfer catalyst are crown ethers, azacrown ethers, onium salt compounds, and the like.

The phase transfer catalyst may be used alone or in combination. Among them, the onium salt compounds are preferable from a standpoint of solubility in water.

Examples of crown ether and azacrown ether are 18-crown-6, 15-crown-5,1-aza-18-crown-6,13-diaza-18-crown-6, 1,4,7-triazacyclononane, and the like.

The onium salt compounds are not particularly limited and may be selected accordingly, and examples thereof are quaternary ammonium salts, pyridinium salts, thiazolium salts, phosphonium salts, piperazinium salts, ephedrinium salts, quininium salts, and cinchoninium salts, and the like.

Examples of quaternary ammonium salts are those used as organic synthesis reagent, namely, tetrabutylammonium hydrogensulfate, tetramethylammonium acetate, tetramethylammonium chloride, and the like.

Examples of pyridinium salts are hexadecylpyridinium bromide, and the like.

Examples of thiazolium salts are 3-benxyl-5-(2-hydroxyethyl)-4-methylthiazolium chloride, and the like.

Examples of phosphonium salts are tetrabutylphosphonium chloride, and the like.

Examples of piperazinium salts are 1,1-dimethyl-4-phenylpiperazinium iodide, and the like.

Examples of ephdrinium salts are ((−)-N,N-dimethylephedrinium bromide), and the like.

Examples of quininium salts are N-benzylquininium chloride, and the like.

Examples of cinchoninium salts are N-benxylcinchoninium chloride, and the like.

The content of the phase transfer catalyst in the resist pattern thickening material depends on the nature and content, etc. of the water-soluble element etc., and it is impossible to define definitely, however, it may be selected according to the nature and content, etc. For example, 10,000 ppm or less is preferable, 10 ppm to 10,000 ppm is more preferable, 10 ppm to 5,000 ppm is further preferable, and 10 ppm to 3,000 ppm is most preferable.

When the content of the phase transfer catalyst is 10,000 ppm or less, it is advantageous in that the resist pattern, such as lines and spaces pattern, etc. can be thickened regardless of size.

The content of the phase transfer catalyst can be measured by liquid chromatography analysis, for example.

—Water-Soluble Aromatic Compound—

The water-soluble aromatic compound is not particularly limited, as long as it is an aromatic compound which exhibits water-solubility and may be selected accordingly. The compound having water-solubility of which 1 g or more is dissolved in 100 g of water at 25° C. is preferable, and the compound having water-solubility of which 3 g or more is dissolved in 100 g of water at 25° C. is more preferable. Particularly, the most preferable is the compound having water-solubility of which 5 g or more is dissolved in 100 g of water at 25° C.

When the resist pattern thickening material comprises the water-soluble aromatic compound, the preferable point is that the etch resistance of the obtained resist pattern can be remarkably improved because of the cyclic structure contained in the water-soluble aromatic compound.

Examples of water-soluble aromatic compound are polyphenol compounds, aromatic carboxylic acid compounds, benzophenone compounds, flavonoid compounds, porphin, water-soluble phenoxy resins, aromatic-containing water-soluble dyes, derivatives thereof, glycosides thereof, and the like. These may be used alone or in combination.

Examples of polyphenol compounds include catechin, anthocyanidin such as pelargonidin-type (4'-hydroxy), cyanidin-type (3',4'-dihydroxy), delphinidin-type (3',4',5'-trihydroxy), and the like, flavan-3,4-diol, proanthocyanidin, resorcine, resorcine[4]arene, pyrogallol, and gallic acid, and the like.

Examples of aromatic carboxylic acid compounds include salicylic acid, phthalic acid, dihydroxy benzoic acid, tannin, and the like.

Examples of benzophenone compounds include alizarin yellow A, and the like.

Examples of flavonoid compounds include flavone, isoflavone, flavanol, flavonone, flavonol, flavan-3-ol, aurone, chalcone, dihydrochalcone, quercetin, and the like.

These may be used alone or in combination. Among them, polyphenol compounds are preferable and catechin, resorcine, and the like are particularly preferable.

Among water-soluble aromatic compounds, from the viewpoint of excellent water-solubility, the compound having two or more polar groups is preferable, the compound having three or more is more preferable, and the compound having four or more is most preferable.

The polar group is not particularly limited and may be selected accordingly. Examples thereof are hydroxyl group, carboxyl group, carbonyl group, sulfonyl group, and the like.

The content of the water-soluble aromatic compound in the resist pattern thickening material may be determined according to the nature, content, etc. of the solubilizer which melts the resist pattern at the temperature near its melting point, water-soluble element, phase transfer catalyst and surfactant, etc.

—Organic Solvent—

The organic solvent is not particularly limited and may be selected accordingly. Examples thereof include alcohol organic solvents, linear ester organic solvents, cyclic ester organic solvents, ketone organic solvents, linear ether organic solvents, cyclic ether organic solvents, and the like.

When the resist pattern thickening material comprises the organic solvent, it is advantageous for improving the solubility of the solubilizer which melts the resist pattern at the temperature near its melting point, water-soluble element, etc. in the resist pattern thickening material.

The organic solvent can be mixed with water for use. Suitable examples of water are pure water (deionized water), and the like.

Examples of alcohol organic solvents are methanol, ethanol, propyl alcohol, isopropyl alcohol, butyl alcohol, and the like.

Examples of linear ester organic solvents include ethyl lactate, propylene glycol methyl ether acetate (PGMEA), and the like.

Examples of cyclic ester organic solvents include lactone organic solvents such as γ-butyrolactone, and the like.

Examples of ketone organic solvents include ketone organic solvents such as acetone, cyclohexanone, and heptanone, and the like.

Examples of linear ether organic solvents include ethyleneglycol dimethylether, and the like.

Examples of cyclic ether organic solvents include tetrahydrofuran, dioxane, and the like.

These organic solvents may be used alone, or in combination. Among them, solvents having a boiling point at about 80° C. to 200° C. are preferable from the viewpoint of precise performance of resist pattern thickening.

The content of the organic solvent in the resist pattern thickening material may be adjusted according to the nature, content, etc. of the solubilizer which melts the resist pattern at the temperature near its melting point, water-soluble element, phase transfer catalyst and surfactant, etc.

—Other Components—

Other components are not particularly limited as long as they do not interfere with effects of the present invention and may be selected accordingly. Examples are various types of known solubilizers including quenchers such as amine type, amide type, ammonium chloride type, and the like.

The content of other components in the resist pattern thickening material can be adjusted according to the nature, content, etc. of the solubilizer which melts the resist pattern at the temperature near its melting point, water-soluble element, phase transfer catalyst and surfactant, etc.

—Use, and the Like—

The resist pattern thickening material of the present invention can be used for coating the resist pattern.

In coating, the surfactant may be coated separately before coating the resist pattern thickening material instead of being added to the resist pattern thickening material.

When the resist pattern thickening material is coated onto the resist pattern and made to interact or mix with the resist pattern, the resist pattern thickening material and the resist pattern undergo interaction to form a mixing layer on the surface of the resist pattern. As a result, the resist pattern is thickened by an amount corresponding to the mixing layer, and a thickened resist pattern is formed.

At this time, because the resist pattern thickening material comprises the solubilizer which melts the resist pattern at the temperature near its melting point, appropriate thickening effect can be obtained without relating to the conditions such as temperature, etc. and the thickening amount of the resist pattern can be easily controlled, enabling to form desired space patterns.

The diameter and/or width of space patterns formed by these thickened resist patterns is smaller than the diameter and/or width of space patterns formed by the resist pattern prior to thickening. As a result, the space patterns more finer than the exposure or resolution limits of light sources of the exposure devices used for resist pattern patterning (which is smaller than the size limits of openings and/or space between patterns which can be patterned by the wavelength of light used for light sources) are formed. Accordingly, when thickening the resist pattern which has been patterned by ArF excimer laser beam using the resist pattern thickening material, the space patterns formed by thickened resist pattern become so fine and precise as though they are patterned by an electron beam, for example.

Note that the thickening amount of resist pattern can be controlled to a desired degree by appropriately adjusting the viscosity, coating thickness, baking temperature, baking time, and the like of the resist pattern thickening material.

—Resist Pattern Material—

The resist pattern material (the resist pattern on which the resist pattern thickening material of the present invention is coated) is not particularly limited and may be selected from known resist materials accordingly. It is preferably the resist pattern material which is exposed by the exposure light of 440 nm or less wavelength.

The exposure light is not limited as long as the exposure wavelength is 440 nm or below and may be selected accordingly. Examples include g-line (436 nm wavelength), i-line (365 nm wavelength), KrF excimer laser beam (248 nm wavelength), ArF excimer laser beam (193 nm wavelength), $F_2$ excimer laser beam (157 nm wavelength), electron beam, and the like. The resist composition which can be suitably patterned by these exposure lights may be selected from known resist materials accordingly and may be negative or positive type. Suitable examples include g-line resists, i-line resists, KrF resists, ArF resists, $F_2$ resists, electron beam resists, and the like. These resists may be chemically amplified types, or non-chemically amplified types. Among them, KrF resists, ArF resists and resists containing acrylic resins are preferable; in addition, ArF resists and resists containing acrylic resin of which there is a pressing need to improve resolution limits for finer patterning and throughput improvement are more preferable.

The ArF resist is not particularly limited and may be selected accordingly and suitable example include alicyclic resist.

Examples of alicyclic resist include acrylic resists having alicyclic functional group in side chains, cycloolefin-maleic acid anhydrate (COMA) resists, cycloolefin resists, hybrid resists such as alicyclic acrylic-COMA copolymer, and the like. These resists may be modified by fluorine.

The alicyclic functional group is not limited and may be selected accordingly and suitable examples include adamantyl functional group, norbornane functional group, and the like. Suitable examples of cycloolefin resists are ones containing adamantane, norbornane, tricyclononene, and the like in main chains.

The process for forming, size, thickness, etc. of the resist pattern is not particularly limited and may be selected accordingly. In particular, thickness can be appropriately determined by the surface of a workpiece and etching conditions, etc. and is generally from about 0.2 μm to 700 μm.

The resist pattern thickening using the resist pattern thickening material of the present invention will be described hereinafter with reference to drawings.

Figure 1B:
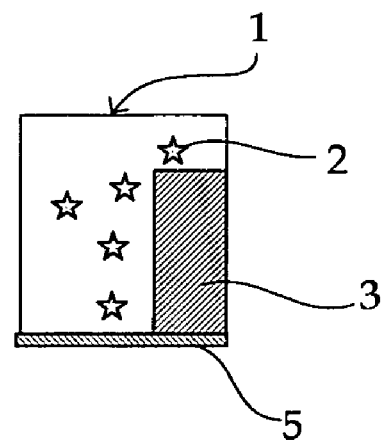
FIG. 1B is a schematic diagram for explaining an example of the mechanism of thickening a resist pattern by using a resist pattern thickening material of the present invention, showing the state where the solubilizer is dispersed in the resist pattern thickening material.
Figure 1C:
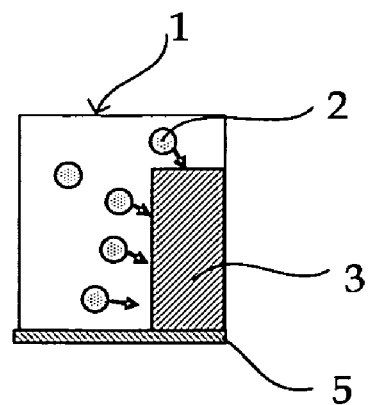
FIG. 1C is a schematic diagram for explaining an example of the mechanism of thickening a resist pattern by using a resist pattern thickening material of the present invention, showing the state where the solubilizer is fused in the resist pattern thickening material.
Figure 2A:
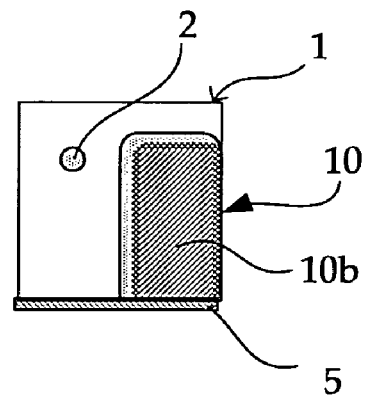
FIG. 2A is a schematic diagram for explaining an example of the mechanism of thickening a resist pattern by using a resist pattern thickening material of the present invention, showing the state where the fused solubilizer is melting the resist pattern to cause a mixing.
Figure 2B:
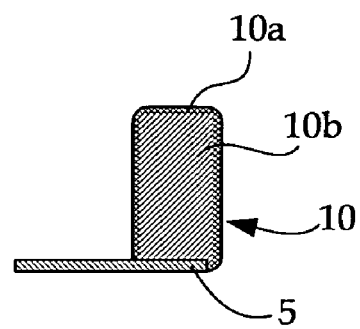
FIG. 2B is a schematic diagram for explaining an example of the mechanism of thickening a resist pattern by using a resist pattern thickening material of the present invention, showing the state where the resist pattern thickening material infiltrates into the surface of the resist pattern.

As shown in FIG. 1A, after a resist pattern 3 has been formed on a work surface (base material) 5, a resist pattern thickening material 1 is coated over the surface of the resist pattern 3. Prebaking (heating and drying) is carried out to form a coated film. At this time, a solubilizer 2 which melts the resist pattern at near the melting point (which may be referred to as "solubilizer" hereafter) that exist near the resist pattern 3 as shown in FIG. 1B is fused by heating as shown in FIG. 1C. And as shown in FIG. 2A, fused solubilizer 2 melts the resist pattern 3 and mixing (infiltrating) of the resist pattern thickening material 1 into the resist pattern 3 occurs at the interface between the resist pattern 3 and the resist pattern thickening material 1. A surface layer (mixing layer) 10a is formed as a result of the reaction of a mixed (infiltrated) portion at the interface of an inner layer resist pattern 10b (the resist pattern 3) and the resist pattern thickening material 1 as shown in FIG. 2B. Because the resist pattern thickening material 1 comprises the solubilizer 2, the inner layer resist pattern 10b (the resist pattern 3) is stably thickened without being affected by thickening conditions such as temperature, density difference of pattern, and the like.

Figure 3:
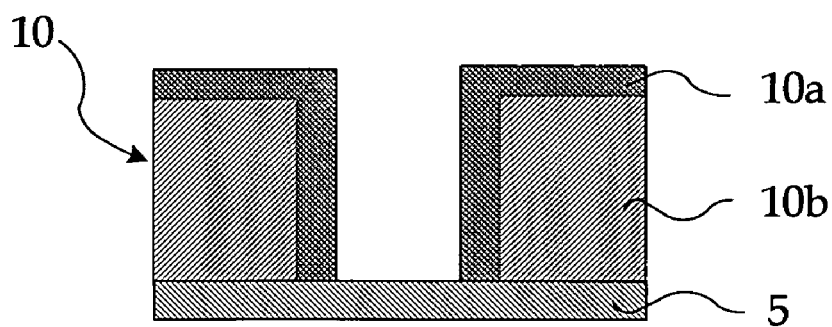
FIG. 3 is a schematic diagram for explaining an example of the mechanism of thickening a resist pattern by using a resist pattern thickening material of the present invention, showing the state where the resist pattern is thickened by the resist pattern thickening material.

Thereafter as shown in FIG. 3, by carrying out development, the portion with no or less interaction (mixing) with the resist pattern 3, the portion with high water-solubility, in coated resist pattern thickening material 1 is dissolved and removed and a thickened resist pattern 10 which is uniformly thickened is formed (developed).

The development may be performed in water, in an alkali solution or in an acid solution; however, development in water is preferable because development can be performed effectively at low cost.

The thickened resist pattern 10 has, on the surface of the inner layer resist pattern 10b (the resist pattern 3), the surface layer (mixing layer) 10a which has been formed as a result of mixing of the resist pattern thickening material 1. Since the thickened resist pattern 10 is thicker than the resist pattern 3 by an amount corresponding to the thickness of the surface layer (mixing layer) 10a, the size of space pattern formed by the thickened resist pattern 10, i.e., the distance between adjacent thickened resist patterns 10 or opening diameter of the hole pattern formed by the thickened resist pattern 10, is smaller than the one formed by the resist pattern 3 prior to thickening. Thus, fine space patterns beyond the exposure or resolution limits of light sources of the exposure device used for forming the resist pattern 3 can be formed. Accordingly, even though it was exposed by using ArF excimer laser light, a fine space patterns, as though it was exposed by an electron beam, can be formed. The space pattern formed by the thickened resist pattern 10 is more fine and precise than the space pattern formed by the resist pattern 3.

The resist pattern thickening material of the present invention may be suitably used for thickening a resist pattern, and miniaturizing the space pattern beyond the exposure limits. In particular, the resist pattern thickening material of the present invention may be suitably used for the process for forming a resist pattern of the present invention, the process for manufacturing a semiconductor device of the present invention, and the like.

(Process for Forming a Resist Pattern)

The process for forming a resist pattern of the present invention comprises forming a resist pattern, coating the resist pattern thickening material of the present invention over the surface of the resist pattern and preferably comprises heating as well as other treatments suitably selected accordingly.

Suitable examples of resist pattern materials are abovementioned materials in the description of the resist pattern thickening material of the present invention.

The resist pattern can be formed in accordance with known methods.

The resist pattern can be formed on the surface of a workpiece (base material). The surface of a workpiece (base material) is not particularly limited and may be selected accordingly. However, when a resist pattern is formed in a semiconductor device, the surface of a workpiece (base material) is, for example, the surface of a semiconductor substrate. Specific examples thereof include the surface of substrates such as silicon wafer, various types of oxide films, and the like.

Methods for coating the resist pattern thickening material are not particularly limited and may be selected from known coating methods accordingly. Suitable examples are spin coating, and the like. In the case where a spin coating is used, the conditions are as follow, for example: about 100 rpm to 10,000 rpm of rotational speed which is preferably 800 rpm to 5,000 rpm, for about 1 second to 10 minutes which is preferably 1 second to 90 seconds.

The thickness of coating is usually about 100 Å to 10,000 Å (10 nm to 1,000 nm) and it is preferably 1,000 Å to 5,000 Å (100 nm to 500 nm).

Note that, at the time of coating, the surfactant may be coated separately before the resist pattern thickening material is coated instead of being contained in the resist pattern thickening material.

It is preferable to heat up (prebaking: heating and drying) the coated resist pattern thickening material during and/or after coating. In this case, the solubilizer which melts the resist pattern at the temperature near its melting point can be easily fused and the resist pattern is melted by fused solubilizer, therefore, resist pattern thickening can be effectively performed.

The temperature of heating (prebaking: heating and drying) is not particularly limited as long as it does not cause softening of the resist pattern and may be selected accordingly. It is preferably the temperature at or above the melting point of the solubilizer which melts the resist pattern at the temperature near its melting point and it is preferably 50° C. to 150° C. and more preferably 70° C. to 130° C., for example.

When heating temperature is less than the melting point of the solubilizer, solubilizer is not fused and thickening effect of resist pattern may not be obtained.

The prebaking may be carried out once, or twice or more times. When prebaking is carried out twice or more times, temperature of each prebaking may be constant or may be different. The prebaking time is preferably about 10 seconds to 5 minutes and more preferably 40 seconds to 100 seconds.

Moreover, according to necessity, carrying out baking of coated resist pattern thickening material after prebaking (heating and drying) is preferable because it can efficiently conduct a reaction of mixed (infiltrated) portion at the interface of the resist pattern and the resist pattern thickening material.

Conditions, methods, and the like of baking are not particularly limited and may be selected accordingly. However, usually, a temperature higher than that at the prebaking (heating and drying) is used. The conditions of baking are, for example, at a temperature of about 70° C. to 150° C. which is preferably 90° C. to 130° C. for about 10 seconds to 5 minutes which is preferably for 40 seconds to 100 seconds.

Moreover, it is preferable to carry out development of coated resist pattern thickening material after coating and/or coating and baking. It is preferable because the portion with no or less interaction (mixing) with the resist pattern, i.e., the portion having high water-solubility, in coated resist pattern thickening material is dissolved and removed and thickened resist pattern can be developed (obtained).

The development may be performed in water, in an alkali solution or in an acid solution. However, development in water is preferable because development can be performed effectively at low cost.

The process for forming a resist pattern of the present invention will be described hereinafter with reference to drawings.

Figure 4:
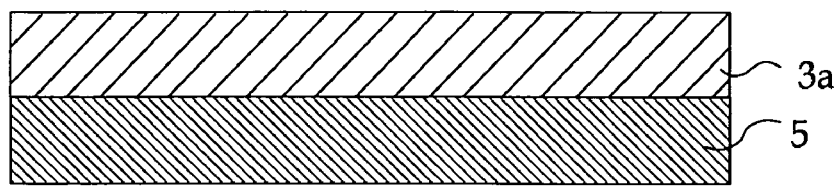
FIG. 4 is a schematic diagram for explaining an example of a process for forming a resist pattern of the present invention, showing the state where a resist film is formed.
Figure 5:
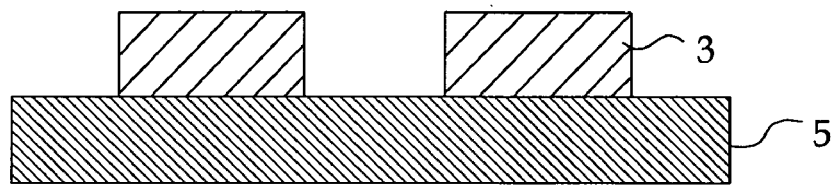
FIG. 5 is a schematic diagram for explaining an example of a process for forming a resist pattern of the present invention, showing the state where the resist film is subjected to a patterning, thereby forming a resist pattern.
Figure 6:
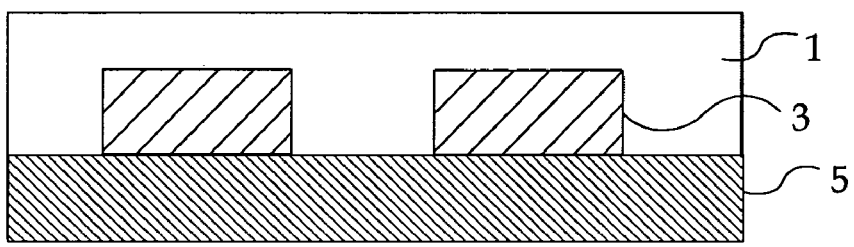
FIG. 6 is a schematic diagram for explaining an example of a process for forming a resist pattern of the present invention, showing the state where the resist pattern thickening material is coated over the surface of the resist pattern.
Figure 7:
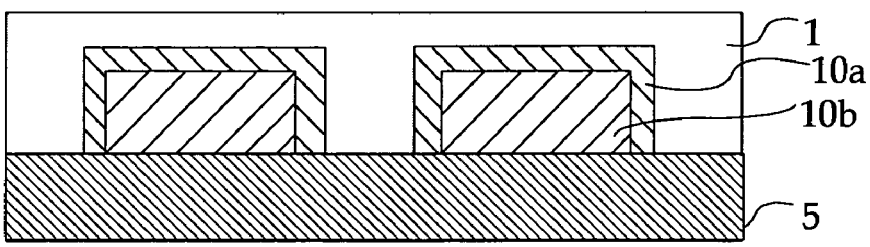
FIG. 7 is a schematic diagram for explaining an example of a process for forming a resist pattern of the present invention, showing the state where a mixing takes place at the surface of the resist pattern and the resist pattern thickening material infiltrates into the resist pattern.
Figure 8:
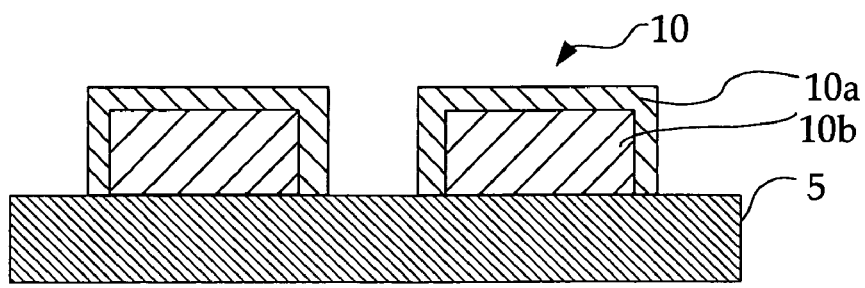
FIG. 8 is a schematic diagram for explaining an example of a process for forming a resist pattern of the present invention, showing the state where the resist pattern thickening material is developed.

As shown in FIG. 4, a resist material 3a is coated on the work surface (base material) 5. Then, as shown in FIG. 5, the resist material 3a is patterned to form a resist pattern 3. Thereafter, as shown in FIG. 6, the resist pattern thickening material 1 is coated on the surface of the resist pattern 3 and heating (prebaking: heating and drying) is carried out to form a coated film. At this time, the solubilizer which melts the resist pattern at near the melting point (which may be referred to as "solubilizer" hereafter) that exists near the resist pattern 3 is fused by heating. And fused solubilizer melts the resist pattern 3 and mixing (infiltrating) of the resist pattern thickening material 1 into the resist pattern 3 takes place at the interface of the resist pattern 3 and the resist pattern thickening material 1. As shown in FIG. 7, the portion mixed (infiltrated) at the interface between the resist pattern 3 and the resist pattern thickening material 1 further react to form a surface layer (mixing layer) 10a. Thereafter, as shown in FIG. 8, by carrying out development, the portion with no reaction or less interaction (mixing) with the resist pattern 3, i.e., the portion having high water-solubility, in coated resist pattern thickening material 1 is dissolved and removed, so that the thickened resist pattern 10 composed of inner layer resist pattern 10b (resist pattern 3) and surface layer 10a thereon is formed (developed).

The development is as described above.

The thickened resist pattern 10 has been thickened by the resist pattern thickening material 1, and has, on the surface of the inner layer resist pattern 10b (resist pattern 3), the surface layer 10a formed as a result of reaction of resist pattern thickening material 1. Upon thickening, since the resist pattern thickening material 1 comprises the solubilizer 2, the inner layer resist pattern 10b (resist pattern 3) is stably thickened without being subject (dependent) to the thickening condition such as temperature, density difference of patterns, and the like.

A resist pattern formed by the process for forming a resist pattern of the present invention (hereinafter sometimes referred to as "thickened resist pattern") is thicker than the resist pattern by an amount corresponding to the thickness of the surface layer (mixing layer). Therefore, diameter or width of the space pattern formed by thickened resist pattern 10 is smaller than that of a space pattern formed by the resist pattern. By using the process for forming a resist pattern of the present invention, a fine space pattern can be formed efficiently.

The thickened resist pattern preferably has high etch resistance. It is preferable that the etching rate (nm/min) of the thickened resist pattern is equivalent to or smaller than that of the resist pattern. Specifically, the ratio of the etching rate (nm/min) of the resist pattern to the etching rate (nm/min) of the surface layer (mixing layer) determined under the same condition, i.e., surface layer (mixing layer)/resist pattern, is preferably 1.1 or more, more preferably 1.2 or more, and most preferably 1.3 or more.

The etching rate (nm/min) can be determined, for example, by measuring a reduction of a sample film after etching for a predetermined time using a conventional etching system and calculating a reduction per unit time.

The process for forming a resist pattern of the present invention is suitable for forming a variety of space pattern, for example, lines and spaces pattern, hole pattern (e.g., for contact-hole), trench (trench) pattern, etc. The thickened resist pattern formed by the process for forming a resist pattern can be used as a mask pattern, reticle pattern, and the like and can be employed for manufacturing functional parts such as metal plugs, various wirings, recording heads, LCDs (liquid crystal displays), PDPs (plasma display panels), SAW filters (surface acoustic wave filters); optical parts used in connecting optical wiring; fine parts such as microactuators; semiconductor devices; and the like. Also, it can be suitably employed in the process for manufacturing a semiconductor device of the present invention which will be described hereinafter.

(Semiconductor Device and Process for Manufacturing thereof)

The process for manufacturing a semiconductor device of the present invention comprises resist pattern forming and patterning and other steps suitably selected as necessary.

The resist pattern forming is a step for thickening a resist pattern by forming a resist pattern on the surface of a workpiece using the resist composition of the present invention, and then by coating the resist pattern thickening material of the present invention over the surface of the resist pattern. The resist pattern forming forms a thickened resist pattern on the surface of the workpiece.

Also in the resist pattern forming process, it is preferable to add heat after coating of the resist pattern thickening material and the heating temperature is preferably at or above the melting point of the solubilizer which melts the resist pattern at the temperature near its melting point.

The heating temperature is not particularly limited and may be selected accordingly and it is preferably 50° C. to 150° C. and more preferably 70° C. to 130° C., for example.

When heating temperature is less than the melting point of the solubilizer, solubilizer does not fuse and the thickening effect of resist pattern may be very small or not be obtained.

Details of the resist pattern forming are similar to those of the process for forming a resist pattern of the present invention.

Examples of surface of the workpiece are surface layers of various members in semiconductor devices. Suitable examples are substrates such as silicon wafers, surface layers thereof, various types of oxide films, and the like. The resist pattern is as described above. The method of coating is also as described above. Further, after coating, it is preferable to carry out above-described prebaking, baking, and the like.

The patterning is a step for patterning the surface of the workpiece by carrying out etching using the thickened resist pattern formed by the resist pattern forming as a mask or the like (as a mask pattern or the like).

Methods for etching are not particularly limited and may be selected from known methods accordingly. Dry etching is a suitable example. The etching conditions are not particularly limited and may be selected accordingly.

Suitable examples of other steps are surfactant coating, development, and the like.

The surfactant coating is a step for coating the surfactant on the surface of the resist pattern before thickened resist pattern forming.

The surfactant is not particularly limited and may be selected accordingly. Suitable examples are the surfactants listed above, and polyoxyethylene-polyoxypropylene condensation product compounds, polyoxyalkylene alkylether compounds, polyoxyethylene alkylether compounds, polyoxyethylene derivative compounds, sorbitan fatty acid ester compounds, glycerin fatty acid ester compounds, primary alcohol ethoxylate compounds, phenol ethoxylate compounds, and nonylphenol ethoxylates, octylphenol ethoxylates, lauryl alcohol ethoxylates, oleyl alcohol ethoxylates, fatty acid esters, amides, natural alcohols, ethylene diamines, secondary alcohol ethoxylates, alkyl cations, amide quaternary cations, ester quaternary cations, amine oxides, betaine surfactants, and the like.

The development is a step for carrying out development of coated resist pattern thickening material after resist pattern forming prior to patterning. Note that the development is as described above.

By using the process for manufacturing a semiconductor device of the present invention, it is possible to efficiently manufacture various types of semiconductor devices such as flash memories, DRAMs, FRAMs, and the like.

The present invention will be illustrated in further detail with reference to examples below, which are not intended to limit the scope of the present invention.

EXAMPLES

Example 1

—Preparation of Resist Pattern Thickening Material—

Resist pattern thickening materials A through M having compositions shown in Table 1 were prepared.

Note that in Table 1, the "thickening material" means a resist pattern thickening material, and "A" through "O" correspond to the resist pattern thickening materials A through O. Of the resist pattern thickening materials A through O, the resist pattern thickening material O corresponds to comparative example and the resist pattern thickening materials A through N correspond to examples (of the present invention).

And "solubilizer" corresponds to the solubilizer which melts the resist pattern at the temperature near its melting point.

In "water-soluble element" column, "KW-3" is a polyvinyl acetal resin (manufactured by Sekisui Chemical Co., Ltd.), "K-30" is a polyvinylpyrrolidone resin (manufactured by Nippon Shokubai Co., Ltd.), "cellulose resin" is manufactured by Polysciences, Inc., "tannic acid" is manufactured by Kanto Chemical Co., Inc., "PVA" is a polyvinyl alcohol resin ("PVA-205C" manufactured by Kuraray Co., Ltd.) and "AZ R500" is a commercially available crosslinking thickening agent (manufactured by AZ Electronic Materials).

TABLE 1

| Thickening Material | Water-Soluble Element | Solubilizer | | Mass Ratio |
|---|---|---|---|---|
| | | Name of Material | Melting Point (° C.) | Water-Soluble Element:Solubilizer |
| A | polyvinyl alcohol | trifluoromethansulfonic acid benzyltriethylammonium salt | 109 | 100:10 |
| B | polyvinyl alcohol | trifluoromethansulfonic acid benzyltriethylammonium salt | 109 | 100:5 |
| C | polyvinyl alcohol | trifluoromethansulfonic acid benzyltriethylammonium salt | 109 | 100:20 |
| D | polyvinyl alcohol | trifluoromethansulfonic acid benzyltriethylammonium salt | 109 | 100:0.1 |
| E | polyvinyl alcohol | trifluoromethansulfonic acid benzyltriethylammonium salt | 109 | 100:150 |
| F | polyvinyl alcohol | trifluoromethansulfonic acid methoxybenzylamine salt | 109 | 100:10 |
| G | polyvinyl alcohol | salicyl alcohol | 121 | 100:10 |
| H | polyvinyl alcohol | 1-phenyl-1-cyclopropanecarboxylic acid | 86 | 100:10 |
| I | polyvinyl alcohol | diphenylamine | 53 | 100:10 |
| J | KW-3 | 1-phenyl-1-cyclopropanecarboxylic acid | 86 | 100:10 |
| K | K-30 | 1-phenyl-1-cyclopropanecarboxylic acid | 86 | 100:10 |
| L | cellulose resin | 1-phenyl-1-cyclopropanecarboxylic acid | 86 | 100:10 |
| M | tannic acid | 1-phenyl-1-cyclopropanecarboxylic acid | 86 | 100:10 |
| N | PVA-205C | toluenesulfonic acid methoxybenzylamine salt | 110 | 100:10 |
| O | AZ R500 | — | — | — |

It was confirmed by infrared spectroscopy analysis that the solubilizer exists in the resist pattern thickening material.

—Resist Pattern Thickening Test—

Using the positive resist ("AX5910" by Sumitomo Chemical Co., Ltd.), a hole pattern having film thickness of 500 nm and opening diameter of 200 nm was formed by irradiating ArF excimer laser beam with exposure amount of 50 mJ/cm$^2$ and developing. On the hole pattern, prepared resist pattern thickening materials A through C were coated by spin coating to have a thickness of 150 nm, first under the condition of 1,000 rpm/5 s, and then under the condition of 3,500 rpm/40 s. Thereafter, baking was carried out under the condition of 110° C./60 s. The resist pattern thickening materials A through C were then rinsed for 60 seconds with pure water and unreacted portions with no interaction (mixing) were removed to develop the resist pattern thickened by the resist pattern thickening materials A through C, respectively. Thus, thickened resist patterns were formed.

The reduction amount (nm) (difference between "space pattern size after thickening" and "space pattern size before thickening") of the space patterns formed by obtained thickened resist patterns were measured. As a result, the resist pattern thickening material A was reduced by 20 nm, the resist pattern thickening material B was reduced by 5 nm and the resist pattern thickening material C was reduced by 40 nm. And it was concluded that it is possible to control the thickening amount of resist pattern in a good reproducible fashion and stably reduce the hole diameter.

Example 2

—Resist Pattern Forming—

Using a KrF resist ("DX5160P" manufactured by AZ Electric Materials), a hole pattern having film thickness of 400 nm and opening diameter of 250 nm was formed. And on the hole pattern, prepared resist pattern thickening materials A, D through I and O were coated by spin coating to have a thickness of 150 nm, first under the condition of 1,000 rpm/5 s and then under the condition of 3,500 rpm/40 s. Thereafter, baking was carried out under the condition of 110° C./60 s for the resist pattern thickening materials A, D, E, G through I and O and 125° C./60 s for the resist pattern thickening material F. Then, the resist pattern thickening materials A, D through I and O were rinsed for 60 seconds with pure water and unreacted portions with no interaction (mixing) were removed to develop the resist pattern thickened by the resist pattern thickening materials A, D through I and O, respectively. Thus, thickened resist patterns were formed.

The reduction amount (nm) (difference between "space pattern size after thickening" and "space pattern size before thickening") of the space patterns formed by obtained thickened resist patterns were measured. Results are shown in Table 2.

An ArF resist ("AR1244J" manufactured by JSR Corporation) was coated on a wafer by spin coating and prebaking was performed under the condition of 110° C./60 s. Next, a hole pattern having thickness of 250 nm and opening diameter of 100 nm was formed by irradiating ArF excimer laser beam with exposure amount of 40 mJ/cm$^2$ through mask and baking under the condition of 110° C./60 s and then developing with 2.38% by mass of TMAH solution for 1 minute. On the hole pattern, prepared resist pattern thickening materials J through N were coated by spin coating, first under the condition of 1,000 rpm/5 s, and then under the condition of 3,500 rpm/40 s to have a thickness of 150 nm and baking was carried out under the condition of 110° C./60 s. Thereafter, the resist pattern thickening materials J through N were rinsed with pure water for 60 seconds and unreacted portions with no interaction (mixing) were removed to develop the resist pattern thickened by the resist pattern thickening materials J through N, respectively. Thus, thickened resist patterns were formed.

The reduction amount (nm) (difference between "space pattern size after thickening" and "space pattern size before thickening") of the space patterns formed by obtained thickened resist patterns were measured. Results are shown in Table 2.

TABLE 2

| Thickening Material | Reduction Amount of Space Pattern After Thickening (nm) | | Difference in Reduction Amount (nm) |
|---|---|---|---|
| | I: 110° C./60 s | II: 120° C./60 s | II − I |
| A | 20 | 22 | 2 |
| D | — | — | — |
| E | — | — | — |
| F | — | 22 (125° C./60 s) | — |
| G | 18 | 22 | 4 |
| H | 27 | 32 | 5 |
| I | 40 | 47 | 7 |
| J | 24 | 30 | 6 |
| K | 22 | 27 | 5 |
| L | 12 | 15 | 3 |
| M | 13 | 17 | 4 |
| N | 20 | — | — |
| O | 50 | 95 | 45 |

In Table 2, "A" and "D" through "O" correspond to the resist pattern thickening materials A and D through O.

From Table 2, it was found that by using the resist pattern thickening material of the present invention, size of the hole patterns could be reduced and moreover, variation in reduction amount by temperature is small and higher margins are obtainable compared to the conventional crosslinking thickening material.

In addition, it was found that when the resist pattern thickening material D, having less content of the solubilizer relative to the water-soluble element, was used for forming hole patterns, there was no notable variation in reduction amount. In contrast, when the resist pattern thickening material E, having more content of the solubilizer relative to the water-soluble element, was used for forming hole patterns, the solubilizer was separated out when applying the resist pattern thickening material E, making film thickness uneven. Because of this, filled holes or uneven reduction amount could be seen in obtained thickened resist pattern.

Further, when the solubilizer in the resist pattern thickening materials A through N were placed on the resist film in a form of powder and fused by heating, it was observed that the resist pattern was fused by the fused matter. It is thought that the solubilizer, even when being contained in the resist pattern thickening material, melts the resist pattern to form a mixing layer and reduce the diameter of hole patterns.

Example 3

Figure 9:
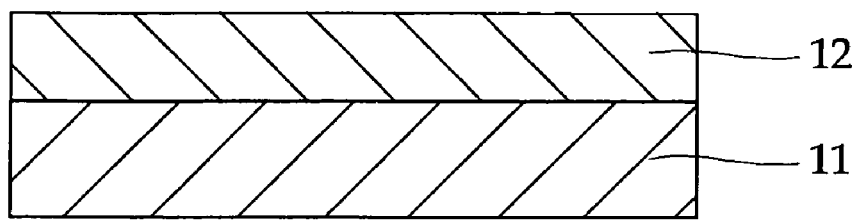
FIG. 9 is a schematic diagram for explaining an example of a process for manufacturing a semiconductor device of the present invention, showing the state where an interlayer dielectric film is formed on a silicon substrate.
Figure 10:
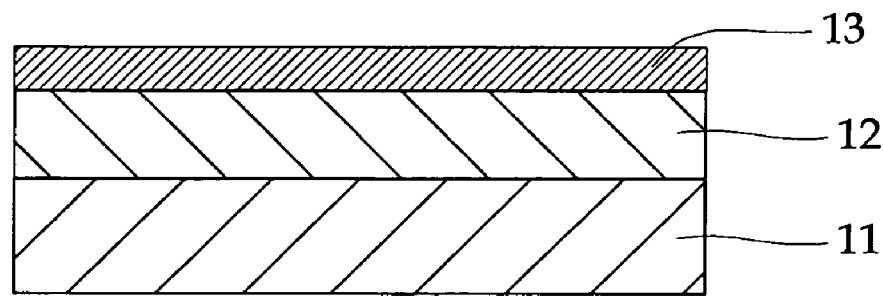
FIG. 10 is a schematic diagram for explaining an example of a process for manufacturing a semiconductor device of the present invention, showing the state where a titanium film is formed on the interlayer dielectric film.
Figure 11:
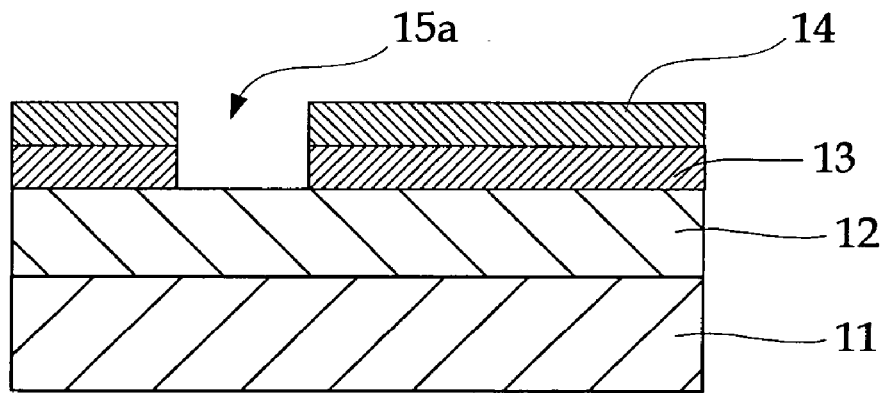
FIG. 11 is a schematic diagram for explaining an example of a process for manufacturing a semiconductor device of the present invention, showing the state where a resist film is formed on the titanium film and a hole pattern is formed on the titanium layer.
Figure 12:
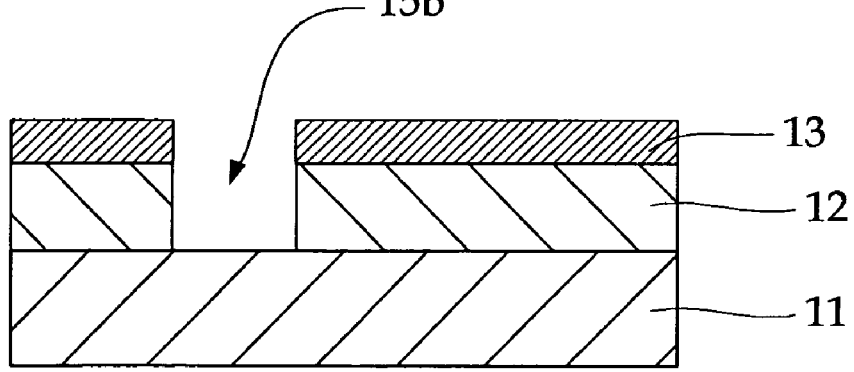
FIG. 12 is a schematic diagram for explaining an example of a process for manufacturing a semiconductor device of the present invention, showing the state where the hole pattern is also formed on the interlayer dielectric film.

As shown in FIG. 9, an interlayer dielectric film 12 was formed on a silicon substrate 11 and as shown in FIG. 10, a titanium film 13 was formed on the interlayer dielectric film 12 by sputtering. Next, as shown in FIG. 11, a resist pattern 14 was formed by known photolithographic technique. By using the resist pattern 14 as a mask, the titanium film 13 was patterned by reactive ion etching to form an opening 15a. Reactive ion etching was continuously carried out to remove the resist pattern 14 and at the same time, as shown in FIG. 12, opening 15b was formed in the interlayer dielectric film 12 by using the titanium film 13 as a mask.

Figure 13:
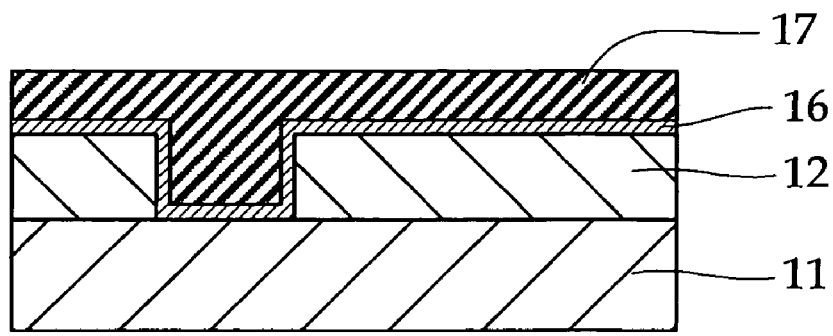
FIG. 13 is a schematic diagram for explaining an example of a process for manufacturing a semiconductor device of the present invention, showing the state where a Cu film is formed on the interlayer dielectric film having the hole pattern.
Figure 14:
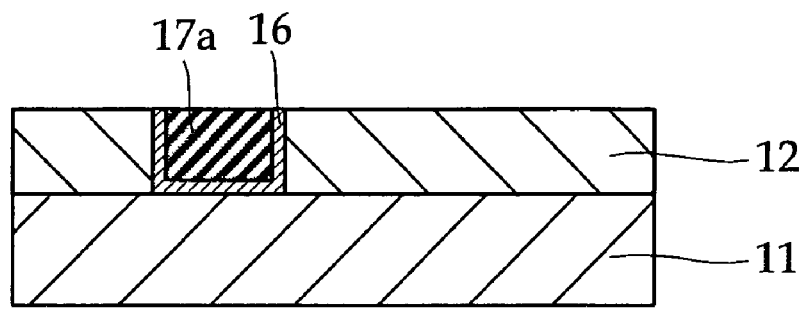
FIG. 14 is a schematic diagram for explaining an example of a process for manufacturing a semiconductor device of the present invention, showing the state where the copper, accumulated on the interlayer dielectric film except where there is hole pattern, is removed.

Next, the titanium film 13 was removed by wet processing and as shown in FIG. 13, a TiN film 16 was formed on the interlayer dielectric film 12 by sputtering. Subsequently, a Cu film 17 was grown by electrolytic plating on the TiN film 16. Next, as shown in FIG. 14, planarizing was carried out by CMP as such that the barrier metal and the Cu film (first metal film) remained only in the trench portions corresponding to the opening 15b (FIG. 12) and a wire 17a of the first layer was formed.

Figure 15:
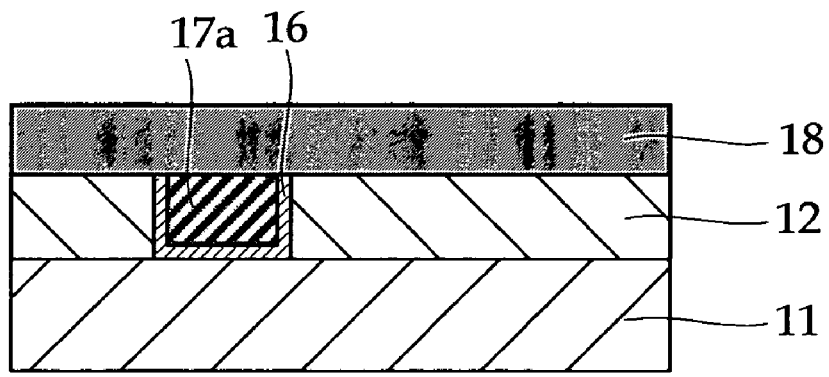
FIG. 15 is a schematic diagram for explaining an example of a process for manufacturing a semiconductor device of the present invention, showing the state where an interlayer dielectric film is formed on the Cu plug formed inside the hole pattern, and on the interlayer dielectric film.
Figure 16:
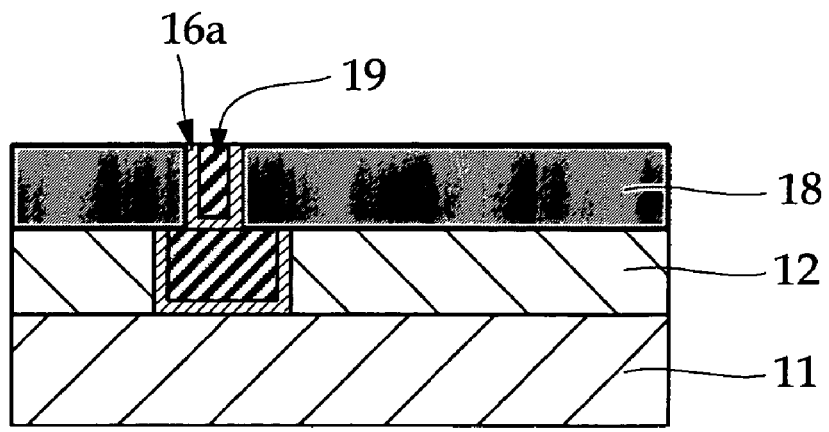
FIG. 16 is a schematic diagram for explaining an example of a process for manufacturing a semiconductor device of the present invention, showing the state where a hole pattern is formed on the interlayer dielectric film as a surface layer and a Cu plug is formed therein.

Next, as shown in FIG. 15, an interlayer dielectric film 18 was formed on the wire 17a of the first layer. Thereafter, by the same procedure as in FIGS. 9 through 14, Cu plug (second metal films) 19 and TiN film 16a, which connects the wire 17a of the first layer to upper layer wires which would be formed later, were formed as shown in FIG. 16.

Figure 17:
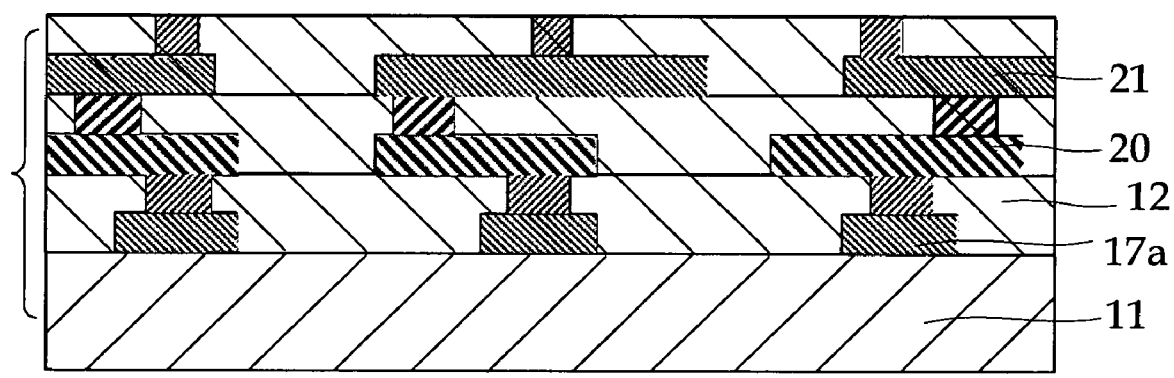
FIG. 17 is a schematic diagram for explaining an example of a process for manufacturing a semiconductor device of the present invention, showing the state where a three-layered wiring is formed.

By repeating the above-described respective processes, as shown in FIG. 17, a semiconductor device equipped with multilayer wiring structure was manufactured having the wire 17a of the first layer, the wire 20 of the second layer, and the wire 21 of the third layer on the silicon substrate 11. Note that the barrier metal layers formed beneath the wires of respective layers are not shown in FIG. 17.

In present Example 3, the resist pattern 14 is the thickened resist pattern formed by the same procedure as in Examples 1 and 2, using the resist pattern thickening material of the present invention.

Example 4

—Flash Memory and Manufacture Thereof—

Example 4 illustrates an embodiment of the semiconductor device and the manufacturing process thereof of the present invention using a resist pattern thickening material of the present invention. In Example 4, resist films 26, 27, 29 and 32 are ones thickened by the same method as in Examples 1 and 2 using the resist pattern thickening material of the present invention.

Figure 18:
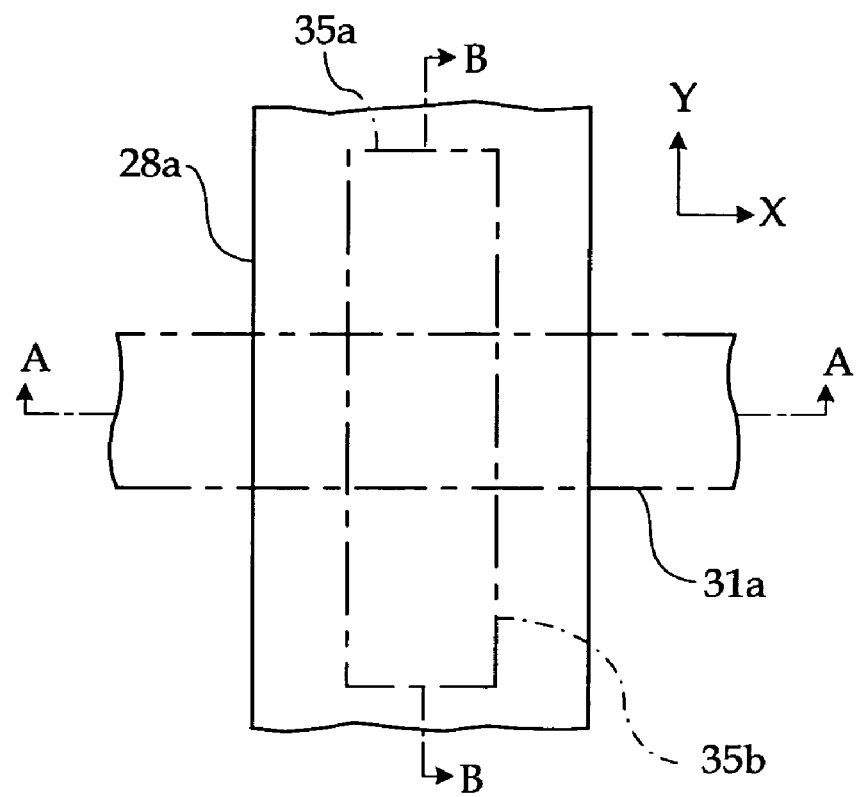
FIG. 18 is a top view for explaining an example of FLASH EPROM manufactured by a semiconductor device of the present invention.
Figure 19:
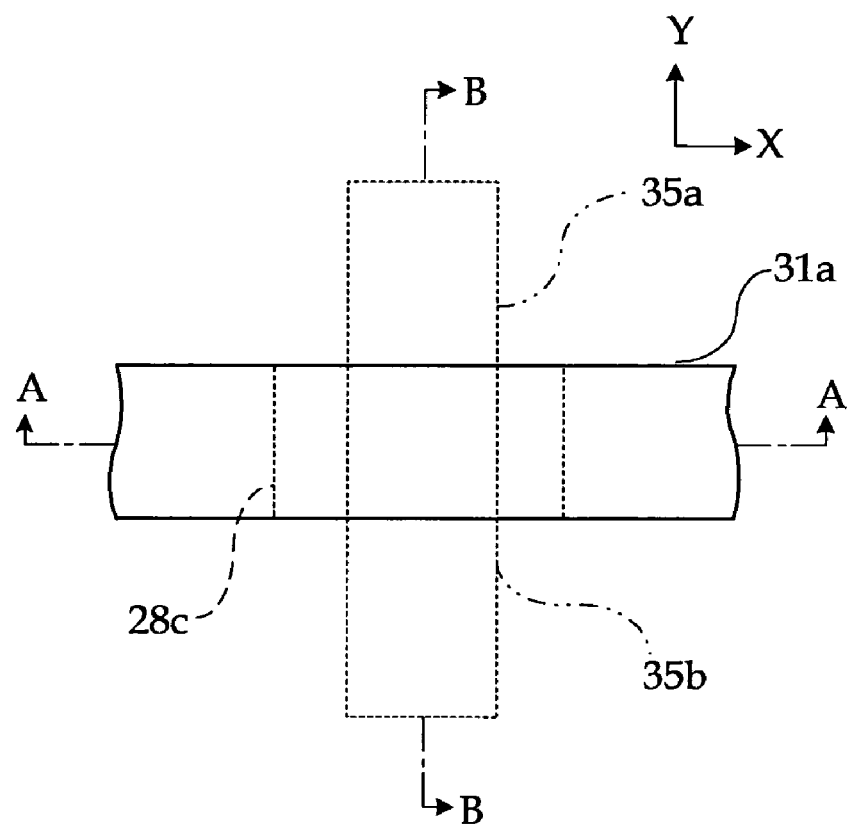
FIG. 19 is a top view for explaining an example of FLASH EPROM manufactured by a semiconductor device of the present invention.

FIGS. 18 and 19 are top views (plan views) of a FLASH EPROM which is called a FLOTOX type or an ETOX type. FIGS. 20 through 28 are schematic sectional views showing an exemplary manufacturing process of FLASH EPROM. In these figures, the left views are schematic sectional views (sectional views taken along lines A-A) of a portion where a MOS transistor having a floating gate electrode is to be formed in gate width direction (X direction in FIGS. 18 and 19) in memory cell unit (first element region). The central views are schematic sectional views (sectional views taken along lines B-B) of the same portion of the memory cell unit as in the left views in gate length direction (Y direction in FIGS. 18 and 19) perpendicular to X direction. The right views are schematic sectional views (sectional views taken along the line A-A in FIGS. 18 and 19) of a portion on which a MOS transistor is to be formed in peripheral circuit unit (second element region).

Figure 20:
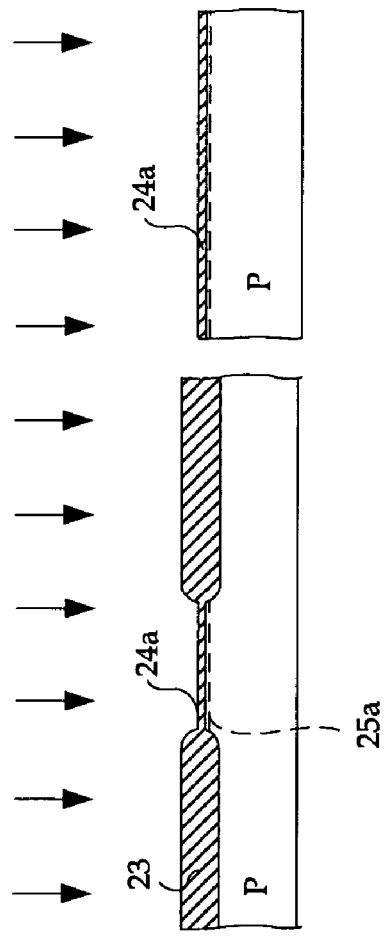
FIG. 20 is a cross-sectional schematic diagram for explaining an example of a process for manufacturing the FLASH EPROM manufactured by a semiconductor device of the present invention.

Initially, a SiO$_2$ film was selectively formed in a device isolation region on a p-type Si substrate 22 to form a field oxide film 23 made of SiO$_2$ film (FIG. 20). Next, a SiO$_2$ film was formed by thermal oxidation to have a thickness of 100 Å to 300 Å (10 nm to 30 nm) as a first gate dielectric film 24a of the MOS transistor in memory cell unit (first element region).

In another step, a SiO$_2$ film was formed by thermal oxidation to have a thickness of 100 Å to 500 Å (10 nm to 50 nm) as a second gate dielectric film 24b of the MOS transistor in peripheral circuit unit (second element region). If the first gate dielectric film 24a and the second gate dielectric film 24b should have the same thickness, these oxide films may be formed simultaneously in one step.

Next, peripheral circuit unit (the right view in FIG. 20) was masked by a resist film 26 to control the threshold voltage for the formation of a MOS transistor having n-type depletion type channels in memory cell unit (the left and central views in FIG. 20). As an n-type dopant, phosphorus (P) or arsenic (As) was injected into a region to be a channel region directly below the floating gate electrode by ion implantation at a dose amount of $1\times10^{11}$ cm$^{-2}$ to $1\times10^{14}$ cm$^{-2}$ to form a first threshold control layer 25a. The dose amount and conductivity type of dopant can be appropriately selected depending on whether the channel is a depletion type or an accumulation type.

Figure 21:
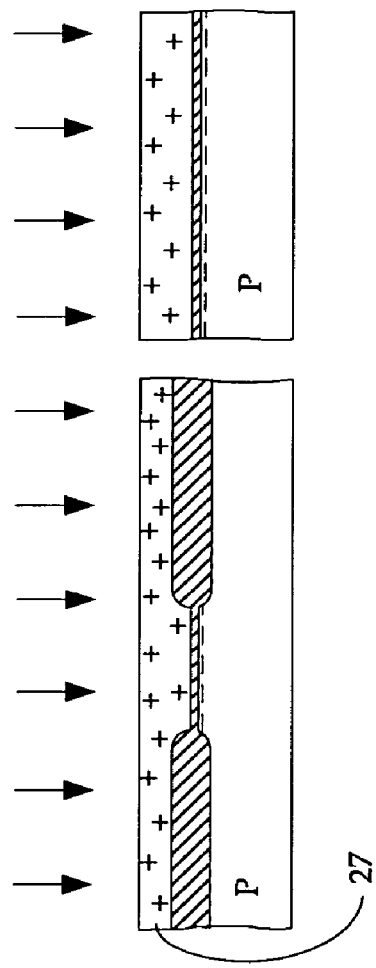
FIG. 21 is a cross-sectional schematic diagram for explaining an example of a process for manufacturing the FLASH EPROM manufactured by a semiconductor device of the present invention, showing a next step of FIG. 20.

Next, memory cell unit (the left and central views in FIG. 21) was masked by a resist film 27 to control the threshold voltage for the formation of a MOS transistor having n-type depletion type channels in peripheral circuit unit (the right view in FIG. 21). As an n-type dopant, phosphorus (P) or arsenic (As) was injected into a region to be a channel region directly below the gate electrode by ion implantation at a dose amount of $1\times10^{11}$ cm$^{-2}$ to $1\times10^{14}$ cm$^{-2}$ to form a second threshold control layer 25b.

Figure 22:
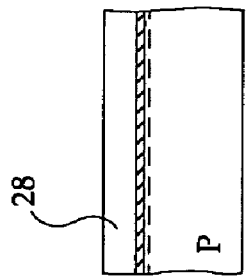
FIG. 22 is a cross-sectional schematic diagram for explaining an example of a process for manufacturing the FLASH EPROM manufactured by a semiconductor device of the present invention, showing a next step of FIG. 21.

A first polysilicon film (first conductive film) 28 having a thickness of 500 Å to 2,000 Å (50 nm to 200 nm) was formed on the entire surface of the article as a floating gate electrode of the MOS transistor in memory cell unit (the left and central views in FIG. 22) and as a gate electrode of the MOS transistor in peripheral circuit unit (the right view in FIG. 22).

Figures 23, 24, 25:
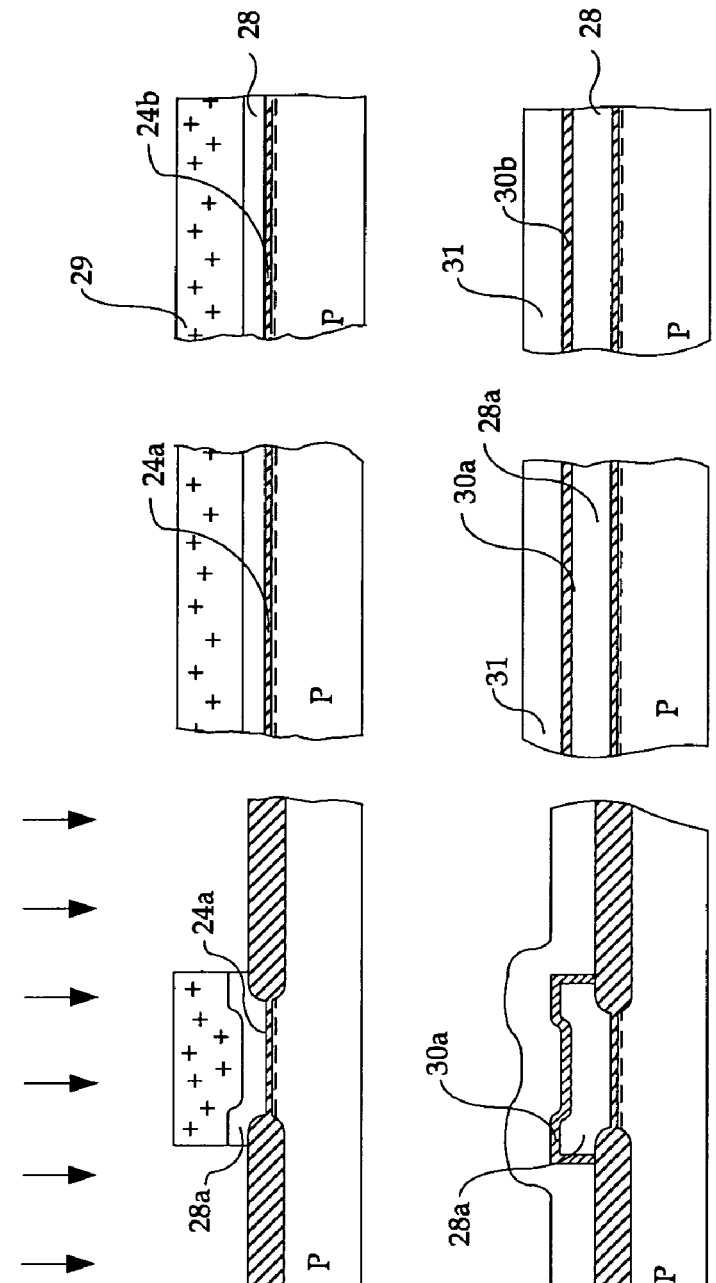
FIG. 23 is a cross-sectional schematic diagram for explaining an example of a process for manufacturing the FLASH EPROM manufactured by a semiconductor device of the present invention, showing a next step of FIG. 22.
FIG. 24 is a cross-sectional schematic diagram for explaining an example of a process for manufacturing the FLASH EPROM manufactured by a semiconductor device of the present invention, showing a next step of FIG. 23.
FIG. 25 is a cross-sectional schematic diagram for explaining an example of a process for manufacturing the FLASH EPROM manufactured by a semiconductor device of the present invention, showing a next step of FIG. 24.

With reference to FIG. 23, a resist film 29 was then formed; the first polysilicon film 28 was patterned using the resist film 29 as a mask to form a floating gate electrode 28a of the MOS transistor in memory cell unit (the left and central views in FIG. 23). In this procedure, the first polysilicon film 28 was patterned in X direction to have intended width and no patterning was done in Y direction to thereby leave a region to be a source-drain (S/D) layer covered by the resist film 29.

After the resist film 29 was stripped, a SiO$_2$ film having a thickness of about 200 Å to 500 Å (20 nm to 50 nm) was formed by thermal oxidation over the floating gate electrode 28a to form a capacitor dielectric film 30a (the left and central views in FIG. 24). In this procedure, a capacitor dielectric film 30b made of SiO$_2$ film was also formed on the first polysilicon film 28 in peripheral circuit unit (the right view in FIG. 24). These capacitor dielectric films 30a and 30b are made of SiO$_2$ film alone but they may comprise a multilayer film having two or three layers of SiO$_2$ film and Si$_3$N$_4$ film.

Next, a second polysilicon film (second conductive film) 31 was formed to have a thickness of 500 Å to 2,000 Å (50 nm to 200 nm) over the floating gate electrode 28a and the capacitor dielectric film 30a (FIG. 24). The second polysilicon film 31 serves as a control gate electrode.

With reference to FIG. 25, the memory cell unit (the left and central views in FIG. 25) was masked by a resist film 32. The second polysilicon film 31 and the capacitor dielectric film 30b in peripheral circuit unit (the right view in FIG. 25) were stripped in turn by etching to thereby expose the first polysilicon film 28.

With reference to FIG. 26, the second polysilicon film 31, the capacitor dielectric film 30a and the first polysilicon film 28a which had been patterned only in X direction of the memory cell unit (the left and central views in FIG. 26) were patterned in Y direction to have final dimensions of the first gate unit 33a using the resist film 32 as a mask. Thus, a multilayer assemblage of control gate electrode 31a, capacitor dielectric film 30c and floating gate electrode 28c having a width of about 1 µm in Y direction was formed. In addition, the first polysilicon film 28 in peripheral circuit unit (the right view in FIG. 26) was patterned to have final dimensions of the second gate unit 33b using the resist film 32 as a mask. And a gate electrode 28b about 1 µm wide was formed.

Phosphorus (P) or arsenic (As) was injected into the Si substrate 22 of element forming region by ion implantation at a dose amount of $1 \times 10^{14}$ cm$^{-2}$ to $1 \times 10^{16}$ cm$^{-2}$ using the multilayer assemblage of the control gate electrode 31a, the capacitor dielectric film 30c and the floating gate electrode 28c in memory cell unit (the left and central views in FIG. 27) as a mask to form n-type source and drain (S/D) region layers 35a and 35b. In addition, phosphorus (P) or arsenic (As) as an n-type dopant was injected into the Si substrate 22 of element forming region by ion implantation at a dose amount of $1 \times 10^{14}$ cm$^{-2}$ to $1 \times 10^{16}$ cm$^{-2}$ using the gate electrode 28b in peripheral circuit unit (the right view in FIG. 27) as a mask to form S/D region layers 36a and 36b.

A phosphate-silicate glass film (PSG film) of about 5,000 Å (500 nm) thickness was formed as an interlayer dielectric film 37 over the first gate unit 33a in memory cell unit (the left and central views in FIG. 28) and the second gate unit 33b in peripheral circuit unit (the right view in FIG. 28).

Subsequently, contact-holes 38a, 38b, 39a, and 39b were formed in the interlayer dielectric film 37 on the S/D region layers 35a, 35b, 36a, and 36b, respectively. S/D electrodes 40a, 40b, 41a and 41b were then formed respectively. In order to form contact-holes 38a, 38b, 39a and 39b, the hole pattern was formed with the resist material and then the resist pattern, which forms the hole pattern, was thickened with the resist pattern thickening material according to the present invention, thereby forming fine space patterns (hole patterns). Thereafter, contact-holes were manufactured in accordance with a conventional method.

Thus, the FLASH EPROM as a semiconductor device was manufactured (FIG. 28).

In obtained FLASH EPROM, the second gate dielectric film 24b in peripheral circuit unit (the right views in FIGS. 20 through 28) remains being covered by the first polysilicon film 28 or the gate electrode 28b after its formation (the right views in FIGS. 20 through 28), thereby keeping its initial thickness. Accordingly, the thickness of the second gate dielectric film 24b can be easily controlled as well as the concentration of a conductive dopant for controlling the threshold voltage.

In above embodiment, the first gate unit 33a is formed by patterning to a given width in gate width direction first (X direction in FIGS. 18 and 19) and then patterning to a final width in gate length direction (Y direction in FIGS. 18 and 19). Alternatively, the first gate unit 33a may be formed by patterning to a given width in gate length direction first (Y direction in FIGS. 18 and 19) and then patterning to a final width in gate width direction (X direction in FIGS. 18 and 19).

Another FLASH EPROM was manufactured by the same procedure as above embodiment, except for the steps subsequent to the step of FIG. 28 were changed to those shown in FIGS. 29, 30 and 31. The procedure was similar to the above embodiment, except for the followings. Specifically, a tungsten (W) film or a titanium (Ti) film about 2,000 Å (200 nm) thick was formed as a refractory metal film (fourth conductive film) 42 on the second polysilicon film 31 in memory cell unit (the left and central views in FIG. 29) and the first polysilicon film 28 in peripheral circuit unit (the right view in FIG. 29) as a polycide film. The steps shown in FIGS. 30 and 31 subsequent to the step of FIG. 29 were carried out in the same manner as in FIGS. 26, 27, and 28 and a detail description thereof is omitted. The same components in FIGS. 29, 30, and 31 as in FIGS. 26, 27, and 28 have the same reference numerals.

Thus, a FLASH EPROM as a semiconductor device was manufactured (FIG. 31).

The obtained FLASH EPROM has the refractory metal films (fourth conductive films) 42a and 42b on the control gate electrode 31a and the gate electrode 28b, enabling to further reduce its electrical resistance.

In this embodiment, the refractory metal films 42a and 42b are used as fourth conductive films. Alternatively, refractory metal silicide films such as titanium silicide (TiSi) films can be used.

Figure 32:
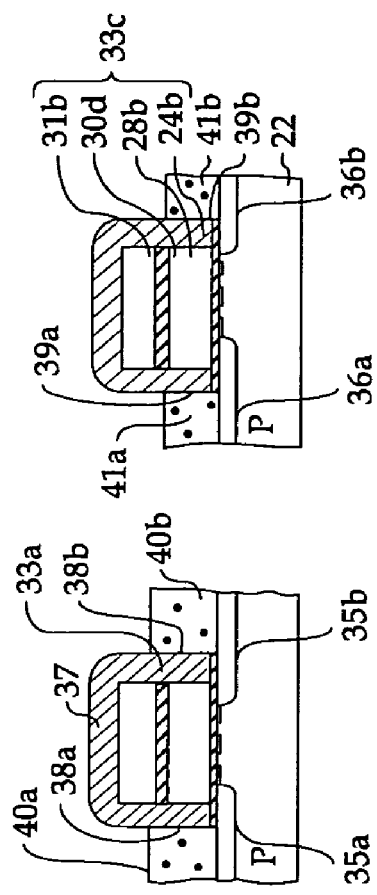
FIG. 32 is a cross-sectional schematic diagram for explaining yet another example of a process for manufacturing the FLASH EPROM manufactured by a semiconductor device of the present invention.

Another FLASH EPROM was manufactured by the same manufacturing procedure as mentioned above except for the second gate unit 33c in peripheral circuit unit (second element region) (the right view in FIG. 32) also has a multilayer structure of a first polysilicon film (first conductive film) 28b, a SiO$_2$ film (capacitor dielectric film) 30d, and a second polysilicon film (second conductive film) 31b arranged in this order same as in the first gate unit 33a in memory cell unit (first element region) (the left and central views in FIG. 32). Also, it differs in that the first polysilicon film 28b and the second polysilicon film 31b are bridged thereby forming a gate electrode (FIGS. 33 and 34).

Figure 33:
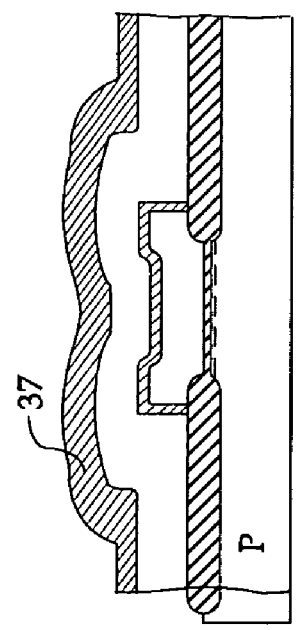
FIG. 33 is a cross-sectional schematic diagram for explaining yet another example of a process for manufacturing the FLASH EPROM manufactured by a semiconductor device of the present invention, showing a next step of FIG. 32.
Figure 33:
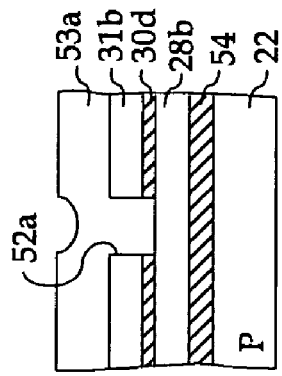
Figure 34:
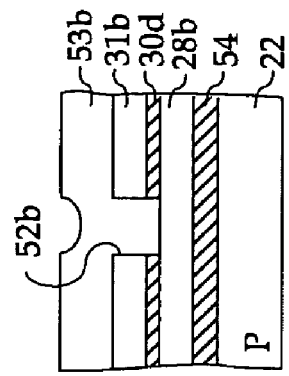
FIG. 34 is a cross-sectional schematic diagram for explaining yet another example of a process for manufacturing the FLASH EPROM manufactured by a semiconductor device of the present invention, showing a next step of FIG. 33.

More specifically, with reference to FIG. 33, the first polysilicon film 28b and the second polysilicon film 31b are bridged by forming an opening 52a, which penetrates the first polysilicon film (first conductive film) 28b, the SiO$_2$ film (capacitor dielectric film) 30d and the second polysilicon film (second conductive film) 31b on a different place other than the second gate unit 33c as shown in FIG. 32 such as on the dielectric film 54 for example, and filling the opening 52a with a refractory metal film (third conductive film) 53a such as W film or Ti film. Alternatively, with reference to FIG. 34, the first polysilicon film 28b and the second polysilicon film 31b may be bridged by forming an opening 52b, which penetrates the first polysilicon film (first conductive film) 28b and the SiO$_2$ film (capacitor dielectric film) 30d, thereby exposing the lower first polysilicon film 28b at the bottom of the opening 52b and filling the opening 52b with a refractory metal film (third conductive film) 53b such as W film or Ti film.

In the FLASH EPROM, the second gate unit 33c in peripheral circuit unit has the same structure as the first gate unit 33a in memory cell unit. Accordingly, the memory cell unit and the peripheral circuit unit can be formed simultaneously to efficiently simplify steps of the manufacturing process.

In this embodiment, the third conductive film 53a or 53b and the refractory metal film (fourth conductive film) 42 were formed independently. Alternatively, these films may be formed simultaneously as a refractory metal film in common.

Example 5

—Manufacture of Magnetic Head—

Example 5 relates to a manufacture of a magnetic head as an application embodiment of the resist pattern formed from the resist pattern thickening material of the present invention. In Example 5, resist patterns 102 and 126 mentioned below are thickened resist patterns formed by the same process as in Example 1 using the resist pattern thickening material of the present invention.

FIGS. 35 through 38 show steps for manufacturing the magnetic head.

Figure 35:
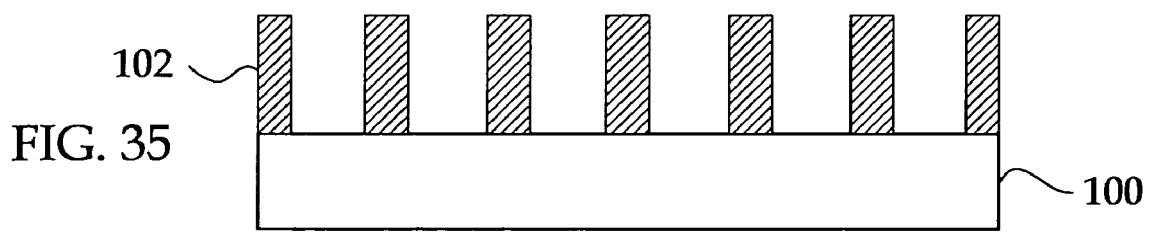
FIG. 35 is a cross-sectional schematic diagram for explaining an example in which a resist pattern, which has been thickened by using the resist pattern thickening material of the present invention, is applied to the manufacturing of a recording head.

Initially, a resist film with a thickness of 6 μm was formed on an interlayer dielectric layer 100. This was then exposed and developed to form a resist pattern 102 having an opening pattern for forming a spiral thin film magnetic coil (FIG. 35).

Figure 36:
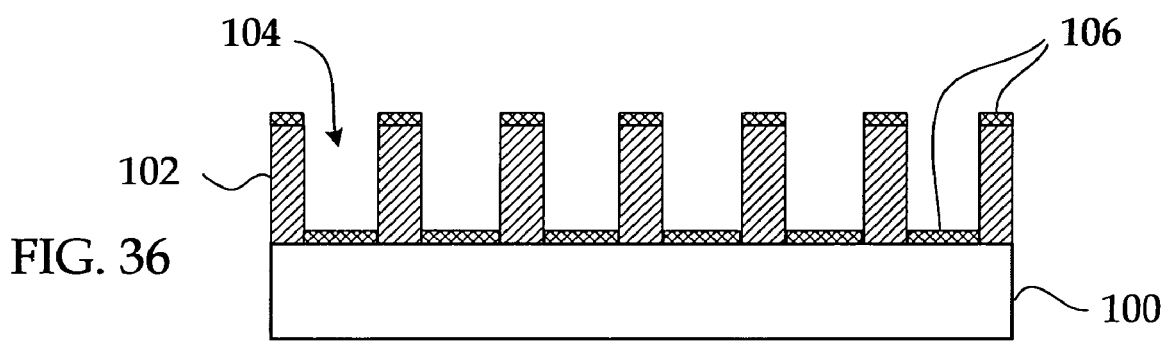
FIG. 36 is a cross-sectional schematic diagram for explaining an example in which a resist pattern, which has been thickened by using the resist pattern thickening material of the present invention, is applied to the manufacturing of a recording head, showing a next step of FIG. 35.

Next, a plated workpiece surface 106 comprising a multilayer structure of Ti contact film with 0.01 μm thickness and Cu contact film with 0.05 μm thickness was formed by vapor deposition on the resist pattern 102 and on the portion of the interlayer dielectric layer 100 where the resist pattern 102 was not formed, which is the exposed surface of the opening 104 (FIG. 36).

Figure 37:
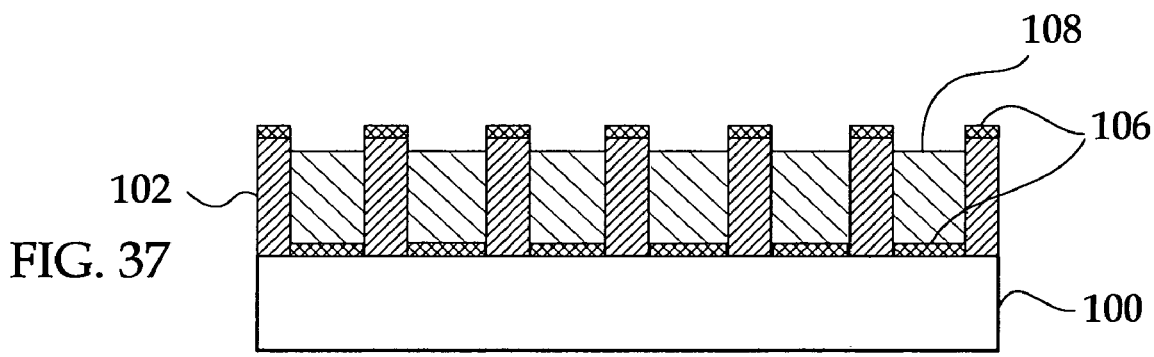
FIG. 37 is a cross-sectional schematic diagram for explaining an example in which a resist pattern, which has been thickened by using the resist pattern thickening material of the present invention, is applied to the manufacturing of a recording head, showing a next step of FIG. 36.

A Cu-plated film of 3 μm thickness as a thin-film conductor 108 was formed on the surface of the plated workpiece surface 106 which was formed on the portion of the interlayer dielectric layer 100 where the resist pattern 102 was not formed, which is the exposed surface of the opening 104 (FIG. 37).

Figure 38:
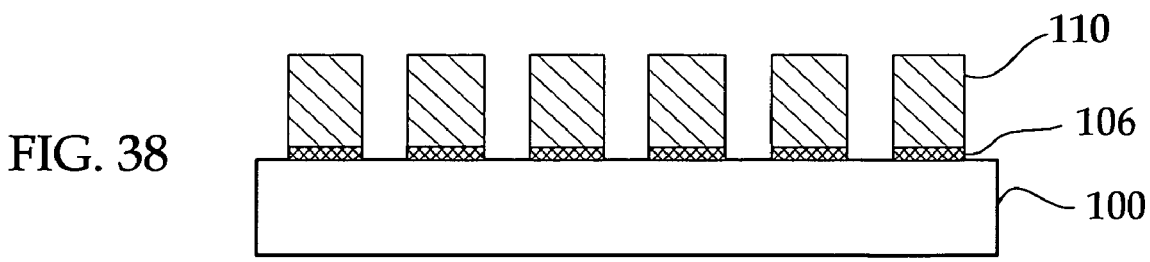
FIG. 38 is a cross-sectional schematic diagram for explaining an example in which a resist pattern, which has been thickened by using the resist pattern thickening material of the present invention, is applied to the manufacturing of a recording head, showing a next step of FIG. 37.

The resist pattern 102 was dissolved and removed by lift-off from the interlayer dielectric layer 100 to form a spiral thin-film magnetic coil 110 derived from the spiral pattern of the thin-film conductor 108 (FIG. 38).

Thus, the magnetic head was manufactured.

Since a fine spiral pattern of the magnetic head has been formed by using the resist pattern 102 thickened by the resist pattern thickening material of the present invention, the thin-film magnetic coil 110 is fine and precise and excels in mass production.

Another magnetic head was manufactured by steps shown in FIGS. 39 through 44.

Figure 39:
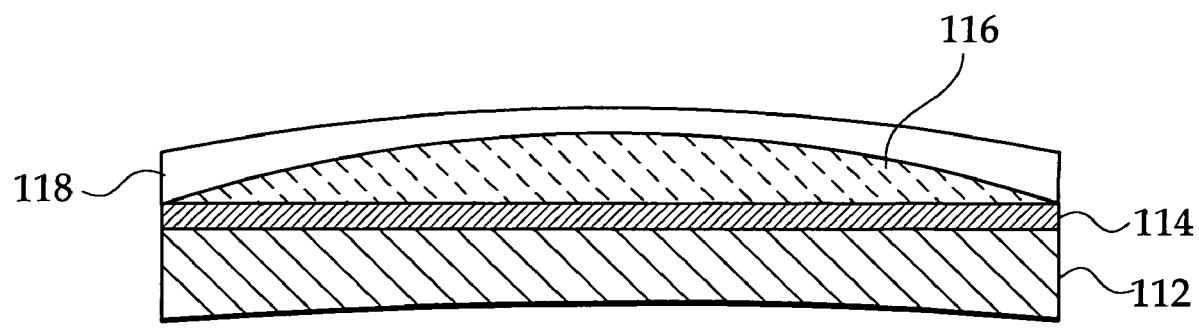
FIG. 39 is a cross-sectional schematic diagram for explaining an example in which a resist pattern, which has been thickened by using the resist pattern thickening material of the present invention, is applied to the manufacturing of a recording head, showing a next step of FIG. 38.

A gap layer 114 was formed by sputtering over a ceramic non-magnetic substrate 112 (FIG. 39). On the non-magnetic substrate 112, an insulating layer of silicon oxide and a conductive workpiece surface of a Ni—Fe Permalloy were formed by sputtering, and a lower magnetic layer of a Ni—Fe permalloy was also formed in advance. These layers are not shown in figures. A resin dielectric film 116 was formed from a thermosetting resin in a given region on the gap layer 114 except for a region to be a magnetic tip of the lower magnetic layer (not shown). A resist material was then coated onto the resin dielectric film 116 to form a resist film 118.

Figure 40:
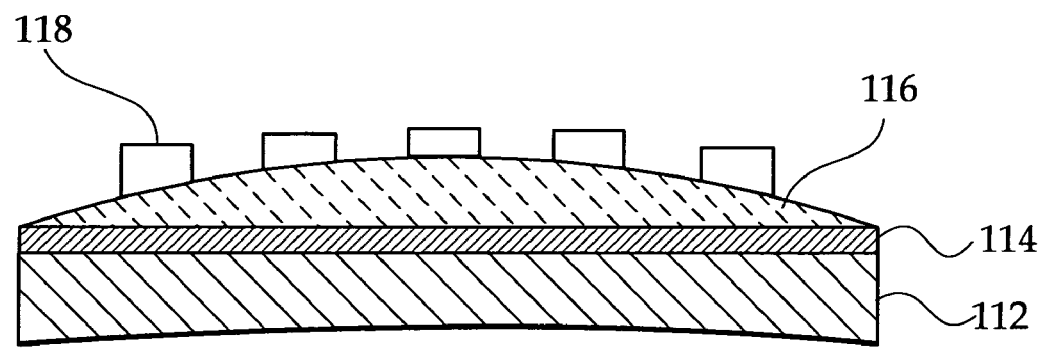
FIG. 40 is a cross-sectional schematic diagram for explaining an example in which a resist pattern, which has been thickened by using the resist pattern thickening material of the present invention, is applied to the manufacturing of a recording head, showing a next step of FIG. 39.
Figure 41:
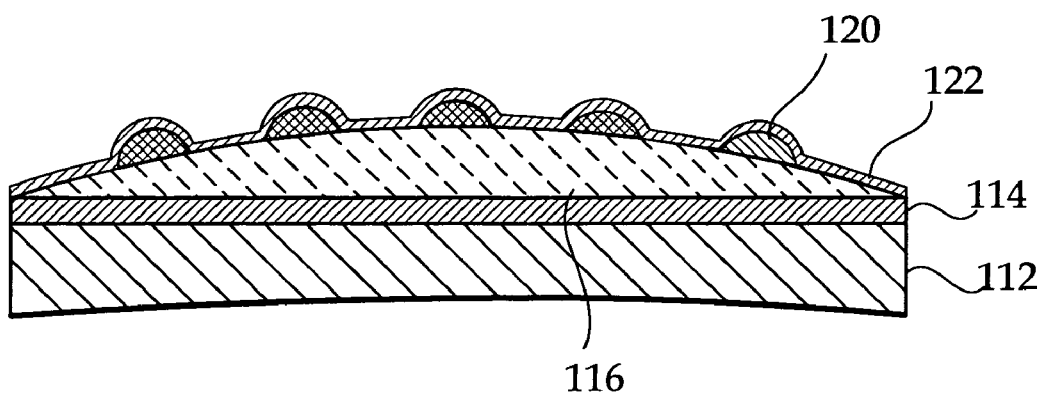
FIG. 41 is a cross-sectional schematic diagram for explaining an example in which a resist pattern, which has been thickened by using the resist pattern thickening material of the present invention, is applied to the manufacturing of a recording head, showing a next step of FIG. 40.

The resist film 118 was exposed and developed to form a spiral pattern (FIG. 40). The spirally patterned resist film 118 was subjected to thermal curing at several hundred Celsius degrees for about one hour to form a protruded first spiral pattern 120 (FIG. 41). A conductive workpiece surface 122 of Cu was formed over the surface of the first spiral pattern 120.

Figure 42:
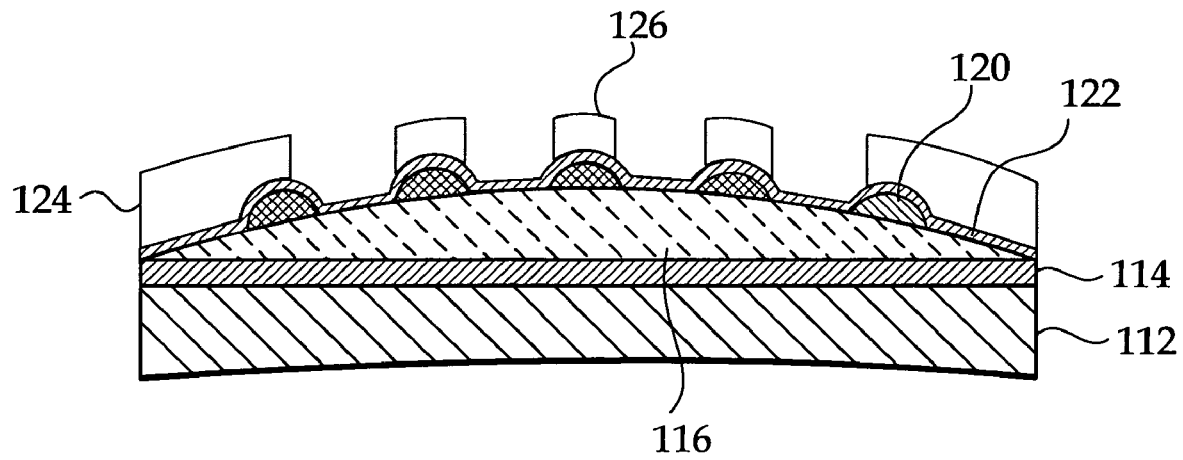
FIG. 42 is a cross-sectional schematic diagram for explaining an example in which a resist pattern, which has been thickened by using the resist pattern thickening material of the present invention, is applied to the manufacturing of a recording head, showing a next step of FIG. 41.

A resist material was coated onto the conductive workpiece surface 122 by spin coating to form a resist film 124. Subsequently, the resist film 124 was patterned corresponding to the first spiral pattern 120 to form a resist pattern 126 (FIG. 42).

Figure 43:
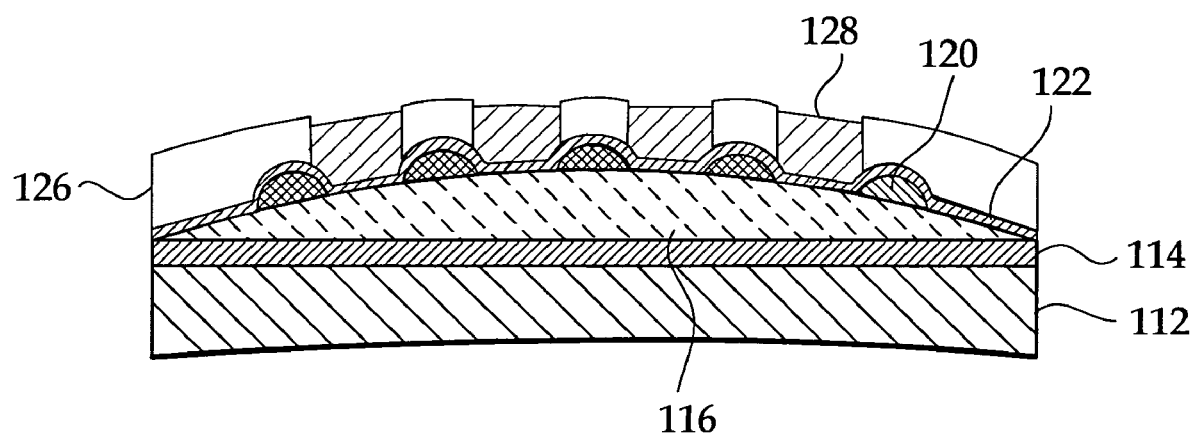
FIG. 43 is a cross-sectional schematic diagram for explaining an example in which a resist pattern, which has been thickened by using the resist pattern thickening material of the present invention, is applied to the manufacturing of a recording head, showing a next step of FIG. 42.
Figure 44:
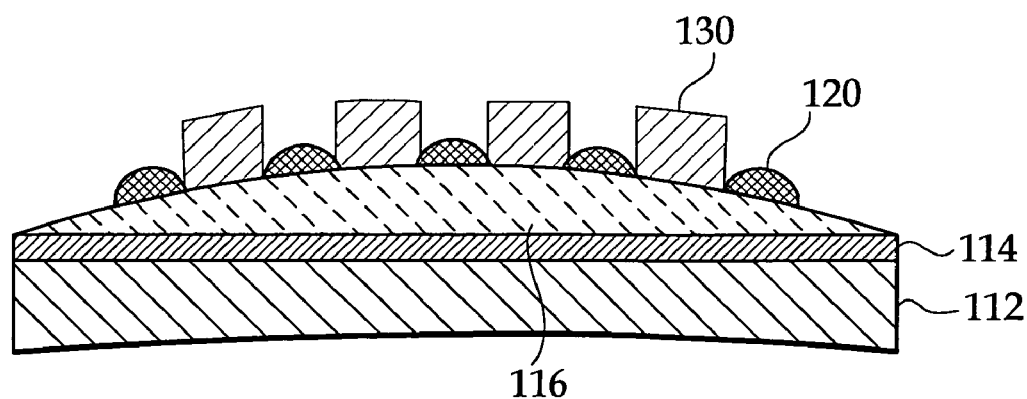
FIG. 44 is a cross-sectional schematic diagram for explaining an example in which a resist pattern, which has been thickened by using the resist pattern thickening material of the present invention, is applied to the manufacturing of a recording head, showing a next step of FIG. 43.

Next, a Cu conductive layer 128 was formed by plating on the exposed surface of the conductive workpiece surface 122 in the portion where the resist pattern 126 was not formed (FIG. 43). The resist pattern 126 was lifted off from the conductive workpiece surface 122 by dissolving and thereby yielding a spiral thin-film magnetic coil 130 derived from the Cu conductive layer 128 (FIG. 44).

Figure 45:
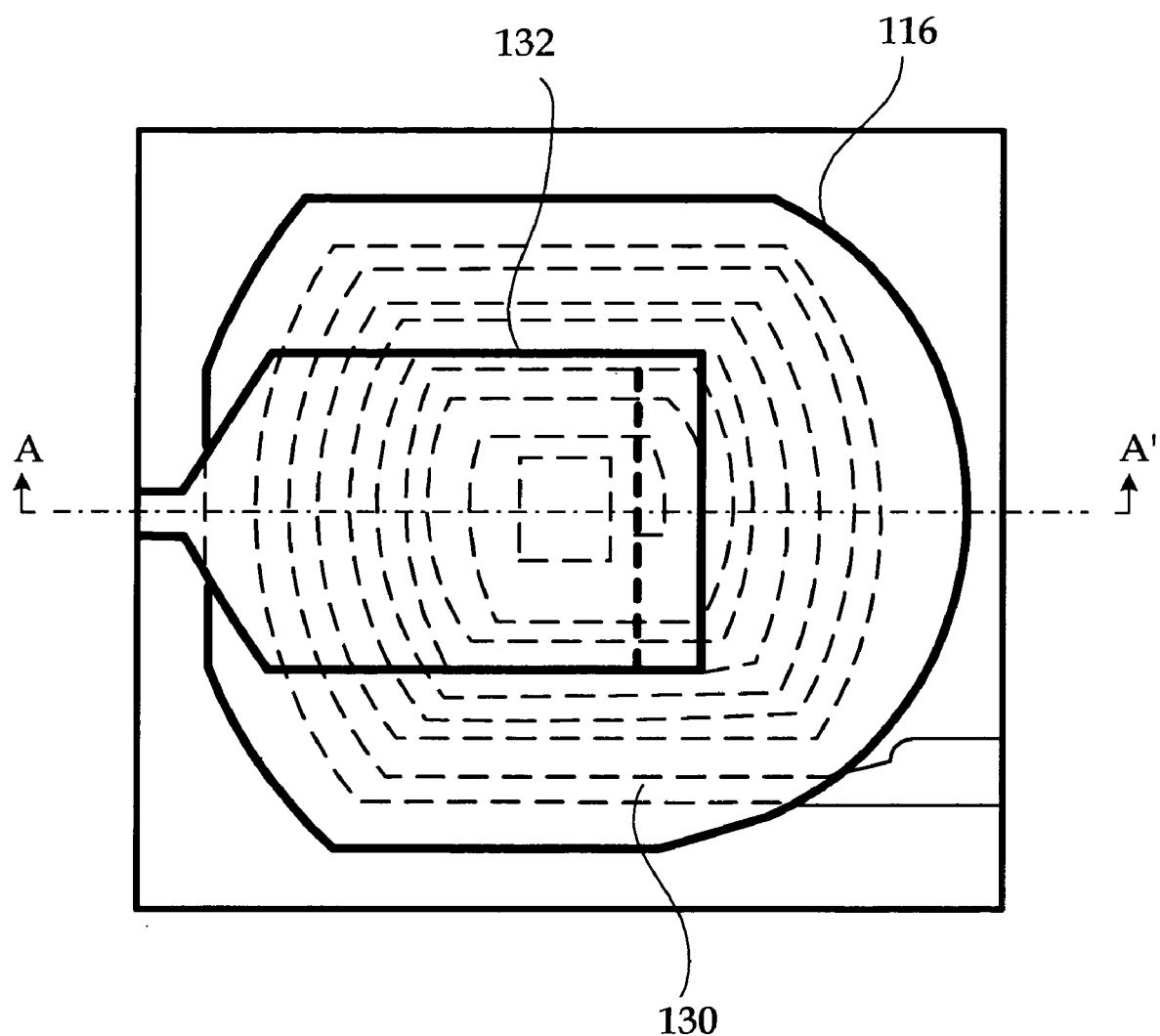
FIG. 45 is a plan view showing an example of the recording head manufactured by the steps in FIGS. 35 through 44.

As a result, the magnetic head as shown in a plan view of FIG. 45 was manufactured. The magnetic head has a magnetic layer 132 on the resin dielectric film 116 with the thin-film magnetic coil 130 on its surface.

Since a fine spiral pattern of the magnetic head has been formed by using the resist pattern 126 thickened by the resist pattern thickening material of the present invention, the thin-film magnetic coil 130 is fine and precise and excels in mass production.

The present invention can solve the conventional problems and achieve the above-mentioned objects.

The present invention can provide a resist pattern thickening material which can utilize ArF excimer laser light as an exposure light during patterning; which, when coated over a resist pattern, can thicken the resist pattern such as lines and spaces pattern, etc. regardless of the composition of ArF resist material, and the like; which can easily control the thickening amount of resist pattern by process condition; and which can easily and efficiently form a fine space pattern beyond the exposure (resolution) limits of light sources of the exposure devices at low cost.

The present invention can also provide a process for forming a resist pattern which can utilize ArF excimer laser light as an exposure light during patterning; which can thicken the resist pattern such as lines and spaces pattern, etc. regardless of the composition of ArF resist material, and the like; which can easily control the thickening amount of resist pattern by process condition; and which can easily and efficiently form a fine space pattern beyond the exposure (resolution) limits of light sources of the exposure devices at low cost.

In addition, the present invention can provide a process for manufacturing a semiconductor device which can utilize ArF excimer laser light as an exposure light during patterning; which can form a fine space pattern beyond the exposure (resolution) limits of light sources of the exposure devices; and which can mass produce high-performance semiconductor devices having fine wiring patterns formed by using the space pattern; and a high-performance semiconductor having fine wiring patterns manufactured by the process for manufacturing a semiconductor device.

The resist pattern thickening material of the present invention is suitable for thickening a resist pattern formed of ArF resist or the like and forming fine patterns, i.e., space pattern and/or wiring pattern, beyond the exposure limit of the light sources used for patterning. Thus the resist pattern thickening material of the present invention is suitable for a variety of patterning methods, semiconductor device manufacturing processes, etc. in particular, for the process for forming a resist pattern and the process for manufacturing a semiconductor device of the present invention.

The process for forming a resist pattern of the present invention is suitable for manufacturing functional parts such as mask patterns, reticle patterns, magnetic heads, LCDs (liquid crystal displays), PDPs (plasma display panels), SAW filters (surface acoustic wave filters); optical parts used in connecting optical wiring; fine parts such as microactuators; semiconductor devices; and the like, and can be employed in the process for manufacturing a semiconductor device of the present invention.

The process for manufacturing a semiconductor device of the present invention can be employed for manufacturing various semiconductor devices, such as flash memory, DRAM, FRAM, and the like.

What is claimed is:

1. A resist pattern thickening material comprising:
 a solubilizer, and
 a water-soluble element,
  wherein the solubilizer melts a resist pattern at the temperature near a melting point of the solubilizer, and the solubilizer is at least one selected from organic salt, alcohol, carboxylic acid and amine, and
  wherein the resist pattern thickening material does not contain a crosslinkable element.

2. The resist pattern thickening material according to claim 1, wherein the solubilizer melts the resist pattern within the melting point of the solubilizer, ±20° C.

3. The resist pattern thickening material according to claim 1, wherein the melting point of the solubilizer is 50° C. to 150° C.

4. The resist pattern thickening material according to claim 1, wherein the solubilizer is water-soluble.

5. The resist pattern thickening material according to claim 1, wherein the acid element in the organic salt is at least one of trifluoromethanesulfonic acid and toluenesulfonic acid.

6. The resist pattern thickening material according to claim 1, wherein the alkali element in the organic salt is at least one of benzyltriethylammonium and methoxybenzylamine.

7. The resist pattern thickening material according to claim 1, wherein the water-soluble element is at least one selected from polyvinyl alcohol, polyvinyl acetal, polyvinyl pyrrolidone, cellulose and tannin.

8. The resist pattern thickening material according to claim 1, wherein the loadings of the solubilizer is 1 part by mass to 100 parts by mass based on 100 parts by mass of water-soluble element.

9. A process for forming a resist pattern comprising:
forming a resist pattern, and
coating a resist pattern thickening material over the surface of the resist pattern,
wherein the resist pattern thickening material comprises:
a solubilizer, and
a water-soluble element,
wherein the solubilizer melts the resist pattern at the temperature near a melting point of the solubilizer, and the solubilizer is at least one selected from an organic salt, alcohol, carboxylic acid and amine, and
wherein the resist pattern thickening material does not contain a crosslinkable element.

10. The process for forming a resist pattern according to claim 9, wherein the resist pattern thickening material is heated after coating of the resist pattern thickening material.

11. The process for forming a resist pattern according to claim 10, wherein the heating is performed at or above the melting point of the solubilizer.

12. The process for forming a resist pattern according to claim 9, wherein the resist pattern thickening material is developed after coating or coating and heating of the resist pattern thickening material.

13. The process for forming a resist pattern according to claim 12, wherein the development is performed using at least one of water, alkali solution and acid solution.

14. A process for manufacturing a semiconductor device comprising:
resist pattern forming wherein a resist pattern is formed on the surface of a workpiece and then a resist pattern thickening material is coated over the surface of the resist pattern to thicken the resist pattern, and
patterning wherein the surface of the workpiece is patterned by etching using thickened resist pattern as a mask,
wherein the resist pattern thickening material comprises:
a solubilizer, and
a water-soluble element,
wherein the solubilizer melts the resist pattern at the temperature near a melting point of the solubilizer, and the solubilizer is at least one selected from an organic salt, alcohol, carboxylic acid and amine, and
wherein the resist pattern thickening material does not contain a crosslinkable element.

15. The process for manufacturing a semiconductor device according to claim 14, wherein the resist pattern forming comprises heating after coating of the resist pattern thickening material.

16. The process for manufacturing a semiconductor device according to claim 15, wherein the heating is performed at or above the melting point of the solubilizer.

17. A semiconductor device manufactured by a process for manufacturing a semiconductor device, wherein the process for manufacturing a semiconductor device comprises:
resist pattern forming wherein a resist pattern is formed on the surface of a workpiece and then a resist pattern thickening material is coated over the surface of the resist pattern to thicken the resist pattern, and
patterning wherein the surface of the workpiece is patterned by etching using thickened resist pattern as a mask,
wherein the resist pattern thickening material comprises:
a solubilizer, and
a water-soluble element,
wherein the solubilizer melts the resist pattern at the temperature near a melting point of the solubilizer, and the solubilizer is at least one selected from an organic salt, alcohol, carboxylic acid and amine, and
wherein the resist pattern thickening material does not contain a crosslinkable element.

* * * * *